US011846887B2

(12) United States Patent
Ma et al.

(10) Patent No.: US 11,846,887 B2
(45) Date of Patent: *Dec. 19, 2023

(54) PROLONGING OPTICAL ELEMENT LIFETIME IN AN EUV LITHOGRAPHY SYSTEM

(71) Applicant: ASML Netherlands B.V., Veldhoven (NL)

(72) Inventors: Yue Ma, Escondido, CA (US); Antonius Theodorus Wilhelmus Kempen, Rosmalen (NL); Klaus Martin Hummler, San Diego, CA (US); Johannes Hubertus Josephina Moors, Helmond (NL); Jeroen Hubert Rommers, Lommel (BE); Hubertus Johannes Van De Wiel, Oss (NL); Andrew David Laforge, Poway, CA (US); Fernando Brizuela, San Diego, CA (US); Rob Carlo Wieggers, Utrecht (NL); Umesh Prasad Gomes, Eindhoven (NL); Elena Nedanovska, Eindhoven (NL); Celal Korkmaz, Eindhoven (NL); Alexander Downn Kim, San Diego, CA (US); Rui Miguel Duarte Rodrigues Nunes, Eindhoven (NL); Hendrikus Alphonsus Ludovicus Van Dijck, IJsselstein (NL); William Peter Van Drent, Best (NL); Peter Gerardus Jonkers, Waalre (NL); Qiushi Zhu, San Diego, CA (US); Parham Yaghoobi, Eindhoven (NL); Jan Steven Christiaan Westerlaken, Heesch (NL); Martinus Hendrikus Antonius Leenders, Rhoon (NL); Alexander Igorevich Ershov, Escondido, CA (US); Igor Vladimirovich Fomenkov, San Diego, CA (US); Fei Liu, Eindhoven (NL); Johannes Henricus Wilhelmus Jacobs, Heeze (NL); Alexey Sergeevich Kuznetsov, Zaltbommel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/715,641

(22) Filed: Apr. 7, 2022

(65) Prior Publication Data
US 2022/0291591 A1   Sep. 15, 2022

Related U.S. Application Data

(63) Continuation of application No. 16/977,360, filed as application No. PCT/EP2019/054924 on Feb. 28, 2019, now Pat. No. 11,340,532.
(Continued)

(51) Int. Cl.
G03F 7/00       (2006.01)

(52) U.S. Cl.
CPC ...... *G03F 7/70166* (2013.01); *G03F 7/70033* (2013.01); *G03F 7/70883* (2013.01); *G03F 7/70916* (2013.01); *G03F 7/70925* (2013.01)

(58) Field of Classification Search
CPC .... G03F 7/70; G03F 7/70033; G03F 7/70166; G03F 7/70175; G03F 7/708;
(Continued)

(56) References Cited

U.S. PATENT DOCUMENTS 6,385,290 B1   5/2002   Kondo et al.
6,504,903 B1   1/2003   Kondo et al.
(Continued)

FOREIGN PATENT DOCUMENTS

DE   102012213927 A1   6/2013
DE   102016125695 A1   1/2018
(Continued)

OTHER PUBLICATIONS

English translation of WO2016/055330, published Apr. 14, 2016. (Year: 2016).*
(Continued)

*Primary Examiner* — Christina A Riddle
(74) *Attorney, Agent, or Firm* — DiBerardino McGovern IP Group LLC

(57) ABSTRACT

Degradation of the reflectivity of one or more reflective optical elements in a system for generating EUV radiation is reduced by the controlled introduction of a gas into a vacuum chamber containing the optical element. The gas
(Continued)

may be added to the flow of another gas such as hydrogen or alternated with the introduction of hydrogen radicals.

25 Claims, 14 Drawing Sheets

Related U.S. Application Data

(60) Provisional application No. 62/803,057, filed on Feb. 8, 2019, provisional application No. 62/736,108, filed on Sep. 25, 2018, provisional application No. 62/638,778, filed on Mar. 5, 2018.

(58) Field of Classification Search
CPC ............ G03F 7/70825; G03F 7/70883; G03F 7/70916; G03F 7/70925; G03F 7/70933; G03F 7/70958; G03F 7/70983; G03F 7/70591; G03F 7/7085; G03F 7/70483–70491; G03F 7/70508; G03F 7/70516; G03F 7/70525; G03F 7/70533; G03F 7/70808; G03F 7/70841; G03F 7/70858; G03F 7/70908–70941; G03F 7/7095; G03F 7/70975; G03F 7/70991; H05G 2/00–008; G02B 27/0006; G02B 5/0891
USPC .................... 355/18, 30, 52–55, 67–77, 133; 250/492.1, 492.2, 492.22, 492.23, 493.1, 250/503.1, 504 R, 505.1; 430/5, 8, 22, 430/30; 359/359, 509
See application file for complete search history.

(56) References Cited

U.S. PATENT DOCUMENTS

| | | | |
|---|---|---|---|
| 6,724,460 B2 | 4/2004 | Van Schaik et al. | |
| 8,764,905 B1 | 7/2014 | Zimmerman et al. | |
| 9,557,650 B2 | 1/2017 | De Dea et al. | |
| 10,073,361 B2 | 9/2018 | Ehm et al. | |
| 10,232,413 B2 | 3/2019 | De Dea et al. | |
| 11,340,532 B2* | 5/2022 | Ma ...................... | G03F 7/70883 |
| 2002/0083409 A1 | 6/2002 | Hamm et al. | |
| 2002/0084425 A1 | 7/2002 | Klebanoff et al. | |
| 2003/0051739 A1 | 3/2003 | Klebanoff et al. | |
| 2004/0105084 A1 | 6/2004 | Kurt et al. | |
| 2005/0104015 A1* | 5/2005 | Wedowski .......... | G03F 7/70925 250/504 R |
| 2007/0030466 A1* | 2/2007 | Shuichi ............... | G03F 7/70916 355/53 |
| 2007/0054497 A1 | 3/2007 | Weiss et al. | |
| 2007/0145297 A1* | 6/2007 | Freriks ................ | G03F 7/70166 250/492.2 |
| 2007/0166215 A1 | 7/2007 | Kempen | |
| 2008/0304031 A1* | 12/2008 | Kanehira ............ | G03F 7/70841 355/53 |
| 2010/0051064 A1 | 3/2010 | Derra et al. | |
| 2010/0071720 A1* | 3/2010 | Ehm .................... | B08B 7/0071 134/21 |
| 2011/0048452 A1 | 3/2011 | Zink et al. | |
| 2012/0025109 A1 | 2/2012 | Abhari et al. | |
| 2012/0223256 A1 | 9/2012 | Bykanov et al. | |
| 2012/0250144 A1 | 10/2012 | Ehm et al. | |
| 2012/0295205 A1 | 11/2012 | Kempen et al. | |
| 2012/0313016 A1 | 12/2012 | Fleurov et al. | |
| 2013/0088697 A1 | 4/2013 | Labetski et al. | |
| 2013/0161540 A1 | 6/2013 | Nagai et al. | |
| 2014/0113235 A1 | 4/2014 | Terashima | |
| 2016/0349412 A1 | 12/2016 | Bowering | |
| 2016/0377984 A1 | 12/2016 | Enkisch | |
| 2017/0060005 A1 | 3/2017 | Chang et al. | |
| 2017/0212433 A1* | 7/2017 | Ehm .................... | G03F 7/70925 |
| 2018/0160517 A1 | 6/2018 | Baek et al. | |
| 2019/0335571 A1 | 10/2019 | Wu et al. | |
| 2020/0142327 A1 | 5/2020 | Roozeboom et al. | |
| 2020/0183292 A1 | 6/2020 | Becker et al. | |

FOREIGN PATENT DOCUMENTS

| | | | |
|---|---|---|---|
| JP | 2002261001 A | 9/2002 | |
| JP | 2005332972 A | 12/2005 | |
| JP | 2008263173 A | 10/2008 | |
| JP | 2009016640 A | 1/2009 | |
| JP | 2014510404 A | 4/2014 | |
| JP | 2017509920 A | 4/2017 | |
| WO | 2016055330 A1 | 4/2016 | |
| WO | WO-2016055330 A1 * | 4/2016 | ......... G03F 7/70033 |
| WO | 2018127565 A2 | 7/2018 | |

OTHER PUBLICATIONS

Wiebo van Toledo, European Patent Office International Searching Authority, International Search Report and Written Opinion, corresponding PCT Application No. PCT/EP2019/054924, dted Jun. 24, 2019, 19 pages total.

Office Action, counterpart Japanese Patent Application No. 2020-542837, dated Feb. 22, 2023, 11 pages total (including English translation of 6 pages).

* cited by examiner

PROLONGING OPTICAL ELEMENT LIFETIME IN AN EUV LITHOGRAPHY SYSTEM

CROSS-REFERENCE TO RELATED APPLICATIONS

This application is a continuation of U.S. application Ser. No. 16/977,360, which is the national phase of PCT/EP2019/054924, which was filed on Feb. 28, 2019, which claims priority of U.S. application 62/803,057, which was filed on Feb. 8, 2019, U.S. application 62/736,108, which was filed on Sep. 25, 2018, and U.S. application 62/638,778, which was filed on Mar. 5, 2018, each of which are incorporated herein in its entirety by reference.

FIELD

The present disclosure relates to systems for the production of extreme ultraviolet radiation. Such systems typically use reflective optical elements arranged in a vacuum environment. The process of generating and controlling EUV radiation in such systems tends to degrade the reflectivity of these optical elements over time. An example of such an environment is the vacuum chamber of an EUV source in which a plasma is created through discharge or laser ablation of a target or source material. In this application, the optical elements are used, for example, to collect and direct the radiation for use outside of the vacuum chamber, e.g., for semiconductor photolithography. Another example is the vacuum chamber housing the optics for the projection system of such an apparatus.

BACKGROUND

EUV radiation, e.g., electromagnetic radiation having wavelengths of around 50 nm or less (also sometimes referred to as soft x-rays), and including radiation at a wavelength of about 13.5 nm, can be used in photolithography processes to produce extremely small features in substrates such as silicon wafers.

Some methods for generating EUV radiation include converting a target material (also called a source material) from a liquid state into a plasma state. The target material preferably includes at least one element, e.g., xenon, lithium or tin, with one or more emission lines in the EUV range. In one such method, laser produced plasma ("LPP"), the required plasma can be produced by using a laser beam to irradiate a target material having the required line-emitting element.

One LPP technique involves generating a stream of target material droplets and irradiating at least some of the droplets with laser radiation pulses. In more theoretical terms, LPP sources generate EUV radiation by depositing laser energy into a target material having at least one EUV emitting element, such as xenon (Xe), tin (Sn), or lithium (Li), creating a highly ionized plasma with electron temperatures of 10's of electron volts.

The energetic radiation generated during de-excitation and recombination of these ions is emitted from the plasma in all directions. In one common arrangement, a near-normal-incidence mirror (often termed a "collector mirror" or simply a "collector") is positioned to collect, direct, and, in some arrangements, focus the radiation to an intermediate location. The collected radiation may then be relayed from the intermediate location to a set of scanner optics and ultimately to a wafer.

In the EUV portion of the spectrum it is generally regarded as necessary to use reflective optics for the collector and other EUV optics. At the wavelengths involved, the collector is advantageously implemented as a multi-layer mirror ("MLM"). As its name implies, this MLM is generally made up of alternating layers of material over a foundation or substrate.

The optical element must be placed within the vacuum chamber with the plasma to collect and redirect the EUV radiation. The environment within the chamber is inimical to the optical element and so limits its useful lifetime, for example, by degrading its reflectivity by any one or a combination of several mechanisms. An optical element within the environment may be exposed to high energy ions or particles of target material which can contaminate the optical element's exposed surface. Particles of target material can also cause physical damage and localized heating of the MLM surface. The target material may be particularly reactive with a material making up at least one layer of the optical element surface. Temperature stability, ion-implantation, and diffusion problems may need to be addressed even with less reactive target materials, e.g., tin, indium, or xenon. Blistering of the MLM coating must also be avoided. Target material may also deposit on the surface of the optical element.

Another major contributor to the collector degradation rate is localized stain formation due to tin debris deposition, for example, around a central aperture of the collector. Depending on EUV source operating vessel pressure, the stain contribution to collector degradation rate may be between about 30% to about 60% of the total rate.

There are techniques which may be employed to increase optical element lifetime despite these harsh conditions. For example, a capping layer may be placed on the optical element to protect the surface of the optical element. To make the capping layer more reflective it may also have multiple layers spaced to increase reflectivity at the wavelength of the radiation to be reflected. Such capping layers are, however, themselves prone to damage through mechanisms such as reduction, hydrogen diffusion, and blistering.

In some systems H2 gas at pressures in the range of about 0.5 to about 3 mbar is used in the vacuum chamber for debris mitigation. Hydrogen is relatively transparent to EUV radiation having a wavelength of about 13.5 nm. H2 gas is introduced into the vacuum chamber to slow down the energetic debris (ions, atoms, and clusters) of target material created by the plasma by collisions with the gas molecules. For this purpose a flow of H2 gas is used which may also be counter to the debris trajectory. This serves to reduce the damage of deposition, implantation, and sputtering target material on the optical coating of the collector.

Another reason for introducing H2 gas into the vacuum chamber is to facilitate cleaning of the collector surface. The EUV radiation generated by the plasma creates hydrogen radicals (denoted herein with the notation H*) by dissociating the H2 molecules. The hydrogen radicals in turn help to clean target material deposits from the collector surface. For example, in the case of tin as the target material, the hydrogen radicals participate in reactions on the collector surface that lead to the formation of volatile gaseous stannane (SnH4) which can be pumped away. For this chemical path to be efficient it is preferred that there is a low rate of H recombination (which reverts to H2 molecules) on the collector surface so that the hydrogen radicals are available for participating in cleaning reactions.

Another cause of collector mirror degradation in the EUV source is capping layer instability. If the capping layer, for example, is oxidic, that is, made of an oxide material, reduction of the oxide material to a metal-rich sub-oxide material or even to metal can cause severe tin contamination because the capping layer then becomes catalytically active to promote both the recombination of atomic hydrogen (thereby reducing the cleaning rate) and also the redeposition of SnHx to form an EUV-blocking Sn layer. If the capping layer, as another example, is made of a nitride material, reduction of the nitride material to a metal-rich sub-nitride material or even to metal can also cause severe tin contamination because the capping layer then becomes catalytically active.

SUMMARY

The following presents a simplified summary of one or more embodiments in order to provide a basic understanding of the embodiments. This summary is not an extensive overview of all contemplated embodiments, and is not intended to identify key or critical elements of all embodiments nor set limits on the scope of any or all embodiments. Its sole purpose is to present some concepts of one or more embodiments in a simplified form as a prelude to the more detailed description that is presented later.

According to one aspect of an embodiment, there is provided a reflective element having a capping layer made of an insulator. The capping layer, for example, may be a nitride or oxide with high resistance to target material deposition, good energy reduction for incident ions, and low secondary electron yield. To promote the cleaning and stability of the capping layer there is provided a gas control system that introduces a flow of a gas containing a mitigation gas, for example, oxygen or nitrogen, across at least a portion of the capping layer. The mitigation gas can also be introduced into other parts of the source to control source material effects or in other vacuum environments of the system where EUV radiation tends to degrade reflectivity.

According to another aspect of an embodiment, there is disclosed an apparatus comprising a vacuum chamber, a reflective optical element arranged in the vacuum chamber and comprising a capping layer, a gas distribution system for adding gas to the vacuum chamber, a source of mitigation gas in selectable fluid communication with the gas distribution system, and a gas control system for controlling the gas distribution system, the gas control system having a state in which the mitigation gas from the source of gas is introduced into the interior of the vacuum chamber in a regulated manner by the gas distribution system. The mitigation gas may be an oxygen-containing or a nitrogen containing gas. The oxygen-containing gas may comprise any one of or a combination of $O_2$, $H_2O$, $H_2O_2$, $O_3$, $CO_2$, and air. The capping layer may comprise an insulator, which may comprise an oxide, which may comprise a metal oxide. The insulator may comprise a nitride. The insulator may comprise a carbide.

The mitigation gas may be made to flow over at least a portion of the capping layer. The gas distribution system may introduce mitigation gas from the source of gas into the vacuum chamber by adding a quantity of mitigation gas to a flow of hydrogen-containing gas. The gas distribution system may be configured to add the mitigation gas to the hydrogen-containing gas by bleeding the mitigation gas into a flow of the hydrogen-containing gas. The mitigation gas may be mixed with an inert gas to obtain a mixture containing at least 0.1% mitigation gas. The mitigation gas may be $O_2$ and may be mixed with an inert gas. The mitigation gas may be $N_2$ and may be mixed with an inert gas. The inert gas may be argon. The mitigation gas may be $H_2O$ and mixed with an inert gas. The mitigation gas may be $CO_2$ and mixed with an inert gas. The mitigation gas may be $O_3$ and mixed with an inert gas. The mitigation gas may be air and mixed with an inert gas. The mitigation gas may be water vapor and with an inert gas. The mitigation gas may be mixed with an inert gas with on the order of $10^{-5}$ mbar inert gas and $10^{-7}$ mbar mitigation gas.

The gas distribution system may have at least one outlet arranged to generate a flow of gas containing the mitigation gas across at least a portion of the capping layer. The gas control system may add the mitigation gas continuously. The gas control system may add the mitigation gas in-line while plasma is being generated. The gas control system may add doses of mitigation gas intermittently.

The apparatus may further comprise a sensor arranged to sense a reflectivity of the optical element and produce a signal indicative of the reflectivity, and the gas control system may receive the signal and control at least one of mitigation gas concentration and mitigation gas composition based at least in part on the reflectivity. The sensor may be arranged to sense mitigation gas concentration adjacent the capping layer and produce a signal indicative of the mitigation gas concentration, and the gas control system may receive the signal and control at least one of mitigation gas concentration and mitigation gas composition based at least in part on the mitigation gas concentration adjacent the capping layer. The gas control system may control at least one of mitigation gas concentration and mitigation gas composition based on a duration of operation of an EUV source including the optical element. The gas control system may controls at least one of mitigation gas concentration and mitigation gas composition based on a number of pulses of EUV radiation produced by an EUV source including the optical element.

The apparatus may further comprise a plurality of structures located within the vacuum chamber for directing a flow of gas within the vacuum chamber, and further comprising a gas distribution system arranged to flow mitigation gas over the structures.

According to another aspect of an embodiment, there is disclosed an apparatus comprising a vacuum chamber, a reflective optical element arranged in the vacuum chamber and comprising a capping layer, a primary gas distribution system for adding hydrogen gas to the vacuum chamber, a secondary gas distribution system for adding a mitigation gas to the vacuum chamber, and a gas control system for controlling the primary gas distribution system and the secondary gas distribution system, the gas control system having a state in which the mitigation gas is introduced into the interior of the vacuum chamber in a regulated manner by the secondary gas distribution system.

According to another aspect of an embodiment, there is disclosed a method comprising the steps of measuring an operating parameter of an EUV light source, the EUV light source comprising a vacuum chamber and a reflective optical element located within the chamber, and controlling addition of a mitigation gas to the vacuum chamber based at least in part on the operating parameter as measured. The step of controlling addition of a mitigation gas may comprise controlling a concentration of the mitigation gas. The step of controlling addition of a mitigation gas may comprise controlling a flow rate of mitigation gas. The step of controlling addition of a mitigation gas may comprise controlling a composition of the mitigation gas. The operating parameter may be reflectivity of the optical element, a concentration of the mitigation gas adjacent the optical element, a duration of operation of the EUV light source, or a number of EUV pulses produced by the EUV light source since a predefined starting time.

According to another aspect of an embodiment, also disclosed is an apparatus comprising a vacuum chamber, a reflective optical element arranged in the vacuum chamber, a gas distribution system having an inlet selectively permitting a flow of gas into the vacuum chamber, a source of mitigation gas in selectable fluid communication with the inlet, a source of gas containing radicals in selectable fluid communication with the inlet, and a gas control system configured to control the gas distribution system, the gas control system having a first state in which the gas control system causes the mitigation gas to be introduced into the vacuum chamber through the inlet and a second state in which the gas control system causes the gas containing radicals to be introduced into the vacuum chamber through the inlet. The source of gas containing radicals may comprise at least one heating element in thermal communication with the inlet and arranged to heat gas flowing through the inlet to a temperature sufficient to create radicals from at least a fraction of the gas in the flow of gas. The source of gas containing radicals may comprise a plasma source arranged to generate radicals in the gas prior to the gas reaching the inlet.

According to another aspect of an embodiment, also disclosed is a method of reducing target material contamination of a reflective surface of reflective optical element in a vacuum chamber in an extreme ultraviolet light source, the method comprising the steps of: (a) starting a flow of mitigation gas into the vacuum chamber; (b) stopping a flow of the mitigation gas into the vacuum chamber; (c) starting a flow of gas containing radicals into the vacuum chamber; and (d) stopping a flow of the gas containing radicals into the vacuum chamber; wherein steps (a)-(d) are repeated in sequence a plurality of times.

According to another aspect of an embodiment, there is disclosed an apparatus comprising a vacuum chamber, a reflective optical element arranged in the vacuum chamber, a gas supply system operative to supply at least a first gas and a second gas to the vacuum chamber, the second gas comprising oxygen, and a control system operative to control the gas supply system to supply the second gas based at least in part on a partial pressure, sensed in the vacuum chamber, of at least one of the first gas and the second gas. The reflective optical element may comprise a capping layer which may comprise an oxide. The oxide may comprise a metal oxide. The control system may be operative to control the gas supply system to supply the second gas based at least in part on a partial pressure, sensed in the vacuum chamber, of the second gas. The control system may be operative to control the gas supply system to supply the second gas based at least in part on a partial pressure, sensed in the vacuum chamber, of the first gas. The second gas may comprise $O_2$. The second gas may comprise $H_2O$. The second gas may comprise $H_2O_2$. The second gas may comprise $O_3$. The second gas may comprise $CO_2$. The second gas may comprise air. The second gas may comprise an inert gas. The inert gas may comprise argon. The inert gas may comprise helium. The second gas may comprise an inert gas mixed with at least 0.1% of an oxygen-containing gas. The apparatus may further comprise a gas pressure sensor arranged to sense a partial pressure of the second gas in the vacuum chamber and to generate a first signal indicative of the partial pressure to the control system, and wherein the control system controls supply of the second gas based at least in part on the first signal. The gas pressure sensor may directly sense the partial pressure of the second gas. The gas pressure sensor may indirectly sense the partial pressure of the oxygen-containing gas by sensing a partial pressure of at least one gas other than the second gas.

According to another aspect of an embodiment, there is disclosed an apparatus comprising a vacuum chamber, a reflective optical element arranged in the vacuum chamber, a gas distribution system for adding gas to the vacuum chamber and having an interface for interfacing with a source of oxygen-containing gas in selectable fluid communication with the gas distribution system, and a gas control system configured to control the gas distribution system to supply the oxygen-containing gas to the vacuum chamber until a partial pressure of the oxygen-containing gas reaches a first value, ceasing supply of the oxygen-containing gas to the vacuum chamber until the partial pressure of the oxygen-containing gas reaches a second value less than the first value, and resuming supply of the oxygen-containing gas to the vacuum chamber until the partial pressure of the oxygen-containing gas reaches a third value greater than the second value. The reflective optical element may comprise a multilayer mirror comprising a capping layer and a plurality of underlying layers, with the capping layer being composed and arranged to protect the underlying layers from damage, the capping layer comprising an oxide. The oxide may comprise a metal oxide. The third value may be substantially equal to the first value. The oxygen-containing gas may comprise $O_2$. The oxygen-containing gas may comprise $H_2O$. The oxygen-containing gas may comprise $H_2O_2$. The oxygen-containing gas may comprise $O_3$. The oxygen-containing gas may comprise $CO_2$. The oxygen-containing gas may comprise air. The second gas may comprise an inert gas. The inert gas may comprise argon. The inert gas may comprise helium. The second gas may comprise an inert gas mixed with at least 0.1% of an oxygen-containing gas. The apparatus may also include a gas pressure sensor arranged to sense a partial pressure of the oxygen-containing gas in the vacuum chamber and to generate a first signal indicative of the partial pressure to the gas control system, and wherein the gas control system controls supply of the oxygen-containing gas based at least in part on the first signal. The gas pressure sensor may directly sense the partial pressure of the oxygen-containing gas. The gas pressure sensor may indirectly sense the partial pressure of the oxygen-containing gas by sensing a partial pressure of at least one gas other than the oxygen-containing gas. The gas pressure sensor may be arranged to sense the partial pressure of the oxygen-containing gas proximate to the reflective optical element.

According to another aspect of an embodiment, there is disclosed a method of prolonging an operational lifetime of a reflective surface in a vacuum chamber of an EUV source, the method comprising the steps of providing a gas supply system operative to supply at least a first gas and a second gas to the vacuum chamber, the second gas comprising oxygen, sensing a partial pressure in the vacuum chamber of at least one of the first gas and the second gas, and controlling the gas supply system to supply the second gas based at least in part on the sensed partial pressure. The sensing step may comprise sensing a partial pressure of the second gas. The sensing step may comprise sensing a partial pressure of the first gas. The second gas may comprise $O_2$. The second gas may comprise $H_2O$. The second gas may comprise $H_2O_2$. The second gas may comprise $O_3$. The second gas may comprise $CO_2$. The second gas may comprise air. The second gas may comprise an inert gas. The inert gas may comprise argon. The inert gas may comprise helium. The second gas may comprise an inert gas mixed with at least 0.1% of an oxygen-containing gas.

According to another aspect of an embodiment, there is disclosed a method of prolonging an operational lifetime of a reflective surface in a vacuum chamber of an EUV source, the method comprising the steps of (a) supplying an oxygen-containing gas to the vacuum chamber; (b) ceasing supplying the oxygen-containing gas to the vacuum chamber when a partial pressure of the oxygen-containing gas reaches a first value; (c) supplying more oxygen-containing gas to the vacuum chamber when the partial pressure of the oxygen-containing gas reaches a second value less than the first value; (d) ceasing supplying the oxygen-containing gas to the vacuum chamber when the partial pressure of the oxygen-containing gas reaches a third value greater than the second value; and (e) repeating steps (c) and (d) to maintain the partial pressure of the oxygen-containing gas between the first value and the second value. The third value may be substantially equal to the first value. The oxygen-containing gas may comprise $O_2$. The oxygen-containing gas may comprise $H_2O$. The oxygen-containing gas may comprise $H_2O_2$. The oxygen-containing gas may comprise $O_3$. The oxygen-containing gas may comprise $CO_2$. The oxygen-containing gas may comprise air. The second gas may comprise an inert gas. The inert gas may comprise argon. The gas may comprise helium. The second gas may comprise an inert gas mixed with at least 0.1% of an oxygen-containing gas. The steps (b), (c), and (d) may each comprise sensing a partial pressure of the oxygen-containing gas in the vacuum chamber. The steps (b), (c), and (d) may comprise directly sensing a partial pressure of the oxygen-containing gas in the vacuum chamber. The steps (b), (c), and (d) may each comprise indirectly sensing a partial pressure of the oxygen-containing gas in the vacuum chamber by sensing a partial pressure of at least one gas other than the oxygen-containing gas. The steps (b), (c), and (d) may each comprise sensing a partial pressure of the oxygen-containing gas in the vacuum chamber proximate to the reflective surface.

Further embodiments, features, and advantages of the present invention, as well as the structure and operation of the various embodiments are described in detail below with reference to accompanying drawings.

BRIEF DESCRIPTION OF THE DRAWINGS

The accompanying drawings, which are incorporated herein and form part of the specification, illustrate the methods and systems of embodiments of the invention by way of example, and not by way of limitation. Together with the detailed description, the drawings further serve to explain the principles of and to enable a person skilled in the relevant art(s) to make and use the methods and systems presented herein. In the drawings, like reference numbers indicate identical or functionally similar elements.

Figure 1:
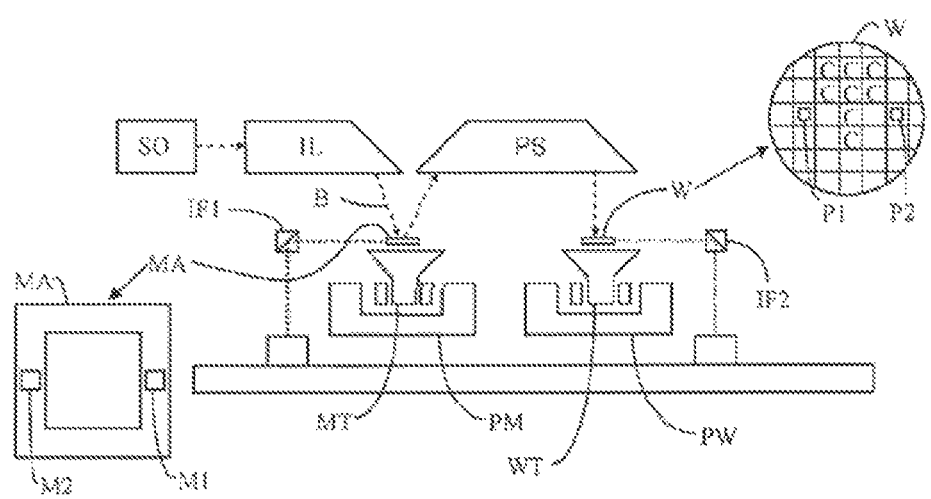
FIG. 1 shows a schematic, not-to-scale, view of an overall broad conception for an EUV lithography system.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments.

FIG. 1 schematically depicts a lithographic apparatus according to an embodiment of the invention. The apparatus comprises an illumination system IL configured to condition a radiation beam B of radiation. The apparatus also includes a support structure (e.g. a mask table) MT constructed to support a patterning device (e.g. a mask or reticle) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS, also referred to as a projection optics box or POB, configured to project a pattern imparted to the radiation beam B by patterning device MA onto a target portion C (e.g. comprising one or more dies) of the substrate W.

The illumination system IL may include various types of optical components, such as refractive, reflective, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as, for example, whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system.

Referring to FIG. 1, the illumination system IL receives a radiation beam from a radiation source SO. The source SO and the illumination system IL, together with the beam delivery system if required, may be referred to as a radiation system. The illumination system IL may comprise an adjuster for adjusting the angular intensity distribution of the radiation beam. Generally, at least the outer and/or inner radial extent of the intensity distribution in a pupil plane of the illumination system can be adjusted. In addition, the illumination system IL may comprise various other components, such as an integrator and a condenser. The illumination system may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan.

Figure 2:
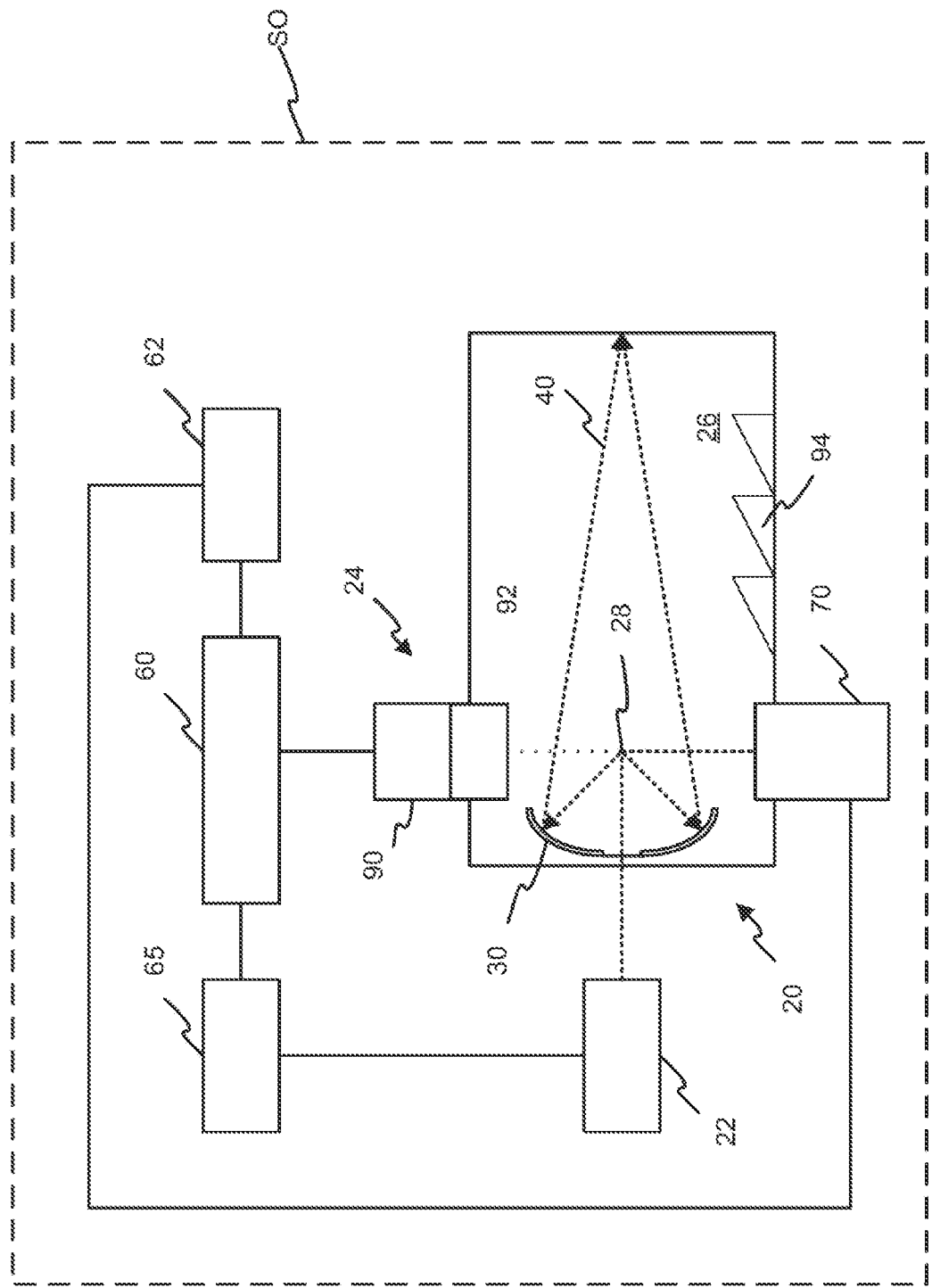
FIG. 2 shows a schematic, not-to-scale, view of an overall broad conception for a laser-produced plasma EUV radiation source system according to an aspect of an embodiment of the present invention.

FIG. 2 is a schematic diagram of an exemplary EUV radiation source SO, e.g., a laser produced plasma EUV radiation source, according to one aspect of an embodiment of the present invention. As shown, the EUV radiation source SO may include a pulsed or continuous laser source 22, which may for example be a pulsed gas discharge $CO_2$ laser source producing radiation at 10.6 μm. The pulsed gas discharge $CO_2$ laser source may have DC or RF excitation operating at high power and high pulse repetition rate.

The EUV radiation source 20 also includes a target delivery system 24 for delivering target material in the form of liquid droplets or a continuous liquid stream. The target material may be made up of tin or a tin compound, although other materials could be used. The target material delivery system 24 introduces the target material into the interior of a chamber 26 to an irradiation region 28 where the target material may be irradiated to produce plasma. In some cases, an electrical charge is placed on the target material to permit the target material to be steered toward or away from the irradiation region 28. It should be noted that as used herein an irradiation region is a region where target material irradiation may occur, and is an irradiation region even at times when no irradiation is actually occurring. As shown, the target material delivery system 24 can include a target delivery control system 90 and a target material dispenser 92.

Continuing with FIG. 2, the radiation source SO may also include one or more optical elements. In the following discussion, a collector 30 is used as an example of such an optical element, but the discussion applies to other optical elements as well. The collector 30 may be a normal incidence reflector, for example, implemented as an MLM, that is, a silicon carbide (SiC) substrate coated with a molybdenum/silicon (Mo/Si) multilayer with additional thin barrier layers, for example B4C, ZrC, Si3N4 or C, deposited at each interface to effectively block thermally-induced interlayer diffusion. Other substrate materials, such as aluminum (Al) or silicon (Si), can also be used. The collector 30 may be in the form of a prolate ellipsoid, with an aperture to allow the laser radiation to pass through and reach the irradiation region 28. The collector 30 may be, e.g., in the shape of a ellipsoid that has a first primary focus at the irradiation region 28 and a second focus at a so-called intermediate point 40 (also called the intermediate focus 40) where the EUV radiation may be output from the EUV radiation source SO and input to the illumination system IL as shown in FIG. 1. The chamber 26 may also be supplied with additional structures such as vanes 94 for controlling the flow of gas within the chamber 26.

Referring again to FIG. 1 the projection system PS (which may be referred to as a projection optics box or "POB") includes a vacuum chamber that contains a number of reflective EUV optical elements that direct radiation from the patterning device MA onto the wafer W. The projection system PS may contain, for example, focusing mirrors (not shown) for focusing patterned radiation onto the wafer W. These reflective EUV optical elements may include so-called grazing incidence mirrors.

Figure 3:
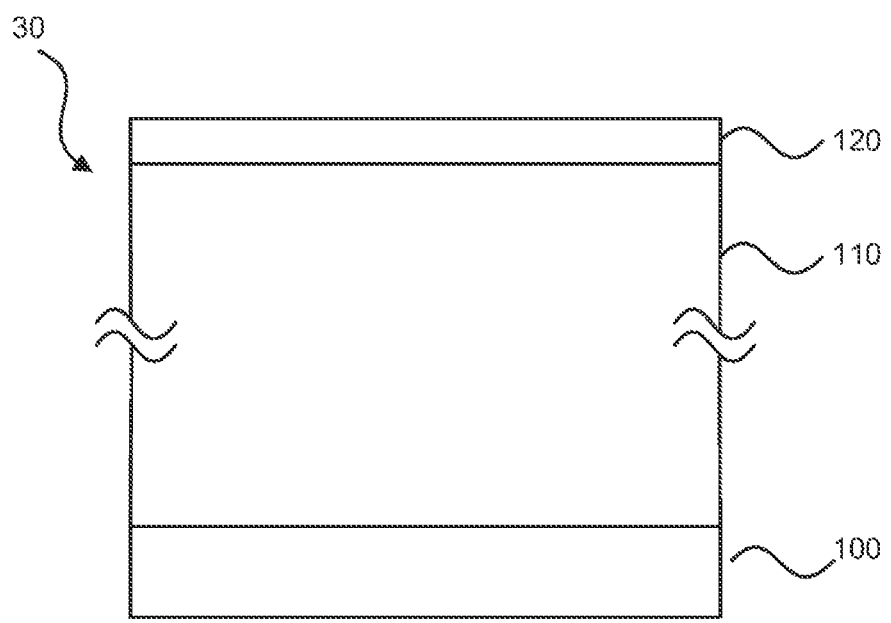
FIG. 3 is a cross sectional diagram of an EUV optical element according to an aspect of an embodiment of the present invention.

As described above, one of the technical challenges in the design of an optical element used in an EUV system is extending its lifetime. One way to extend the lifetime of optical element involves protecting it from damage by using an outermost capping layer. An example of an EUV optical element with such a capping layer is shown in FIG. 3 which is a cross section though a portion of such a collector 30. As can be seen there, the collector 30 includes a substrate 100. A multilayer coating 110 is located on the substrate 100. The multilayer coating 110 is made up of alternating layers of material, for example, molybdenum and silicon, in a known fashion. Located on the multilayer coating 110 is a capping layer 120 which may be made up of an outermost layer and a series of repeating bilayers. As used herein, a capping layer is a layer added for the purpose of protecting the collector 30 without excessively decreasing the overall reflectivity of the collector 30 at the wavelengths of interest, e.g., 13.5 nm. It is advantageous to provide for a capping layer system that protects the collector 30 surface against target material (e.g., tin) deposition, hydrogen ion penetration, hydrogen diffusion, and hydrogen or oxygen induced blistering. It is also advantageous to select materials for the capping layer 120 that will resist blistering.

Referring again to FIG. 3, the capping layer 120 (or the topmost layer of the capping layer 120 if the capping layer 120 is a multilayer cap) may be an insulating material such as a ceramic or a nitride or oxide with high resistance to target material deposition. In other words, these may be materials having a low recombination rate for atomic hydrogen to enable a high formation rate of stannane. These would typically be materials having a hydrogen recombination coefficient in a range of about $10^{-4}$ to about $10^{-3}$. Effectively this means the preferred material exhibits a good tin cleaning rate because the H can react with Sn before it recombines to H2. A preferred material for the topmost layer 130 of the capping layer 120 also preferably exhibits good energy reduction for incident ions and low secondary electron yield. Examples of suitable materials include insulators such as ZrN, TiO2, Ta2O5, and ZrO2. In general, metals and ceramic compounds that could oxidize to a determined thickness without affecting the multilayer coating underneath can also be used. The insulator may be chosen to minimize hydrogen radical recombination and SnH3 and SnH4 decomposition.

In general, the EUV source vacuum quality is intended to be as clean as possible (lowest possible levels of O2, N2, H2O etc.) to prevent any oxidation risk or unwanted chemical reaction with either tin or plasma as this could cause collector degradation. Also, for example, oxygen can undesirably cause oxidation of other components in the vacuum chamber such as the nozzle of the droplet generator. It has, however, been determined that the presence of low levels of gases which would otherwise be regarded as impurities can have a positive effect on preserving or enhancing reflectivity of optical elements in the system. For the collector in the source, one mechanism is depletion of oxygen from the capping layer, which results in increased tin accumulation on the capping layer.

It is thus advantageous to deliberately supply a controllable amount of such a gas or a mixture of such gases into, for example, the vacuum chamber of the source SO or the projection system PS. Such a non-hydrogen gas or mixture of gases including a non-hydrogen gas, when they are deliberately introduced into the vacuum chamber, will be referred to herein as a mitigation gas because their deliberate introduction serves to mitigate through chemical and/or physical reactions and processes that would otherwise degrade reflectivity. These mitigation gases can be supplied, for example, either in an air mixture (extra clean dry air or XCDA) or mixed with a noble or inert gas (e.g. Ar).

One method of adding a mitigation gas to the vacuum chamber is to bleed the mitigation gas into the flow of hydrogen gas into the chamber. For example, an oxygen/water containing gas can be added to the vacuum chamber by adding it to the hydrogen flow passing close to the collector to increase the local concentration of the mitigation gas to a level that stabilizes the capping layer without consuming a significant amount of H* in a water-gas reaction. The mitigation gas can thus, for example, be any one of or a mixture of O2, H2O, H2O2, O3, and N2 in relative proportion to inhibit unwanted reactions and effects and promote desired reactions and effects. It should be noted that water photo-dissociates into H2 and O2 under EUV. For example, a mixture of argon and oxygen can be added. The mixture of argon and O2 could be on the order of $10^{-5}$ mbar Ar and $10^{-7}$ O2, for example, 2E-5 mbar AR and 4E-7 mbar O2. The mixture to be used can be determined based on reflectivity measurements. The upper limit of mitigation gas concentration is determined in part by deep oxidation underneath of the capping layer. The exact limits depend on the plasma load driven by the EUV light.

There are engineering risks associated with introducing an oxygen-containing gas, an oxygen-containing gas being used to refer to a gas containing O2 or an oxygen compound such as H2O. As used herein, the phrase "gas comprising hydrogen" also means a gas containing O2 or an oxygen compound such as H2O. For example, the presence of an oxygen-containing gas may cause oxidation of the nozzle of the droplet generator. Such risks can be mitigated by switching off the addition of the oxygen-containing gas during droplet generator startup and by monitoring the rate of success of restarting the droplet generator.

The above discussion is primarily in terms of a reflective optic located in the source vacuum chamber. The beneficial effects of adding a mitigation gas to the gas mixture in a vacuum chamber also extend to reflective EUV optics located in other parts of the system, such as the reflective optical elements in the POB. For example, mitigation gas can be added to the gas mix in the vacuum chamber of the POB to inhibit etching of the surfaces of reflective optical elements that are located there and mitigate SiH4 formation. The pressure of mitigation gas at a mitigation gas inlet to this vacuum environment may be on the order of 1E-8 mbar. As another example, the patterning device MA is also in a vacuum environment, sometimes referred to as the reticle stage or the reticle micro-environment. Again, low concentrations of mitigation gas can be added here to mitigate SiH4 formation. The mitigation gas may be oxygen and may be mixed with nitrogen. The pressure of mitigation gas at a mitigation gas inlet to this vacuum environment may be on the order of 4E-8 mbar. For both of these environments, the lower end of the range for mitigation gas concentration is determined primarily by the least amount needed to obtain the benefit of SiOx mitigation. The lower end of the range for mitigation gas concentration is determined primarily by the need to avoid deep oxidation. The desired concentration of the mitigation gas depends to some extent on the ion flux the SiOx-containing surface of the reflective EUV optic is subjected to, with a lower ion flux incurring a lower demand for the presence of mitigation gas.

As a specific example, a metallic oxide may be chosen as the collector cap material for its limited H* recombination and $SnH_4$ redeposition. Reduction of the metallic oxide to metal (or a sub-oxide or sub-nitride) will undesirably cause the surface of the capping layer to promote H* recombination and $SnH_4$ redeposition. Flowing a gas containing oxygen or nitrogen over the capping layer stabilizes the metallic oxide or nitride capping layer, resulting in more tin cleaning. The oxygen or nitrogen concentration may be chosen to promote this effect while not consuming excessive amounts of H* (forming water), which would leave less H* available for the tin cleaning reaction. At intermediate levels of oxygen, tin can oxidize, which requires more H* to clean, but reduces $SnH_4$ redeposition. The goal is promote preferred reactions such as tin cleaning ($Sn+xH^* \rightarrow SnH_x$) and metallic oxidation ($metal+\frac{1}{2}xO2 \rightarrow (metal)O_x$) while inhibiting unwanted reactions such as reduction ($(metal)Ox+2xH^* \rightarrow metal+H_2O$), water formation ($2H^*+O^* \rightarrow H2O$), H* recombination ($2H^{**} \rightarrow H2$), and SnH4 redeposition ($SnHx \rightarrow Sn+\frac{1}{2}xH2$). The same applies to nitrogen.

Other candidate materials for the insulator include nitrides. These could be stabilized, for example, by adding as a mitigation gas nitrogen or ammonia mixtures. They can also be stabilized with oxygen as the oxygen oxidizes areas of the capping layer that have become depleted of nitrogen thus restoring conditions for suppressing unwanted reactions and promoting desired reactions. Additional candidate materials for the insulator include carbides. These could be stabilized, for example, by adding CH4 and/or light hydrocarbons.

Figure 4:
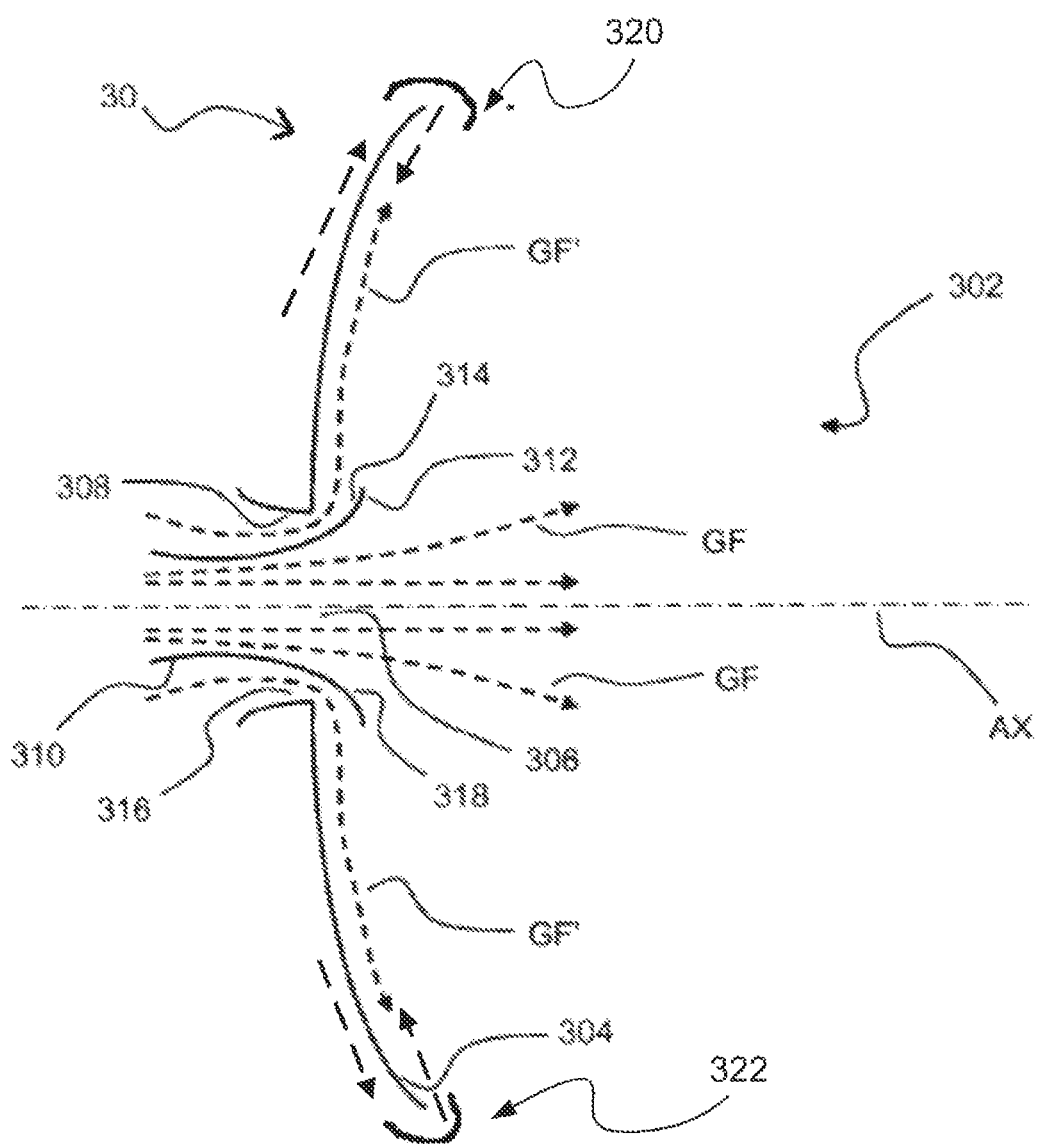
FIG. 4 is a cross sectional diagram of gas flows over an EUV optical element according to an aspect of an embodiment of the present invention.

In the source it is desirable that the flow of the gas mixture be established to flow across (i.e., adjacent to and with a velocity component parallel to) at least part of the surface of the EUV reflective optic. This can be accomplished, for example, by adding outlets to a system for flowing hydrogen in the chamber and then adding the mitigation gas to the flow of hydrogen. As mentioned, the collector 30 may be in the form of a prolate ellipsoid, with a central aperture 306 to allow the laser radiation to pass through and reach the irradiation region 28. A collector and gas flow assembly 302 is shown in FIG. 4. The central aperture 306 extends through the reflective surface 304 of the collector mirror 30. The central aperture 306 is located on an axisymmetric line AX of the collector 30. The central aperture 306 has an edge 308. The assembly 302 is provided with a tubular body 310 (also referred to as flow cone 310), which extends through the central aperture 306. The tubular body 310 has an inner surfaces 312 and 318 and an outer surface 314.

The word "tubular" will be understood by the skilled person as a broad term, which may encompass or be synonymous with a variety of different structures. For example, a tubular body may not have parallel walls, but could instead be conical or flared. The tubular body may be any structure that forms a conduit from one side of the collector (e.g. a non-collecting surface) to another, opposite side of the collector (e.g. a collecting surface). The tubular body might have a circular cross-section, or an elliptical cross-section, or any other suitable cross-section.

In use, a main gas flow GF is directed through the tubular body 310 which, in this embodiment, is constructed and arranged to guide the gas flow GF in a direction transverse to the reflective surface 304. For example, the inner surface 312 of the tubular body 310 is constructed and arranged to guide the gas flow GF in a direction transverse to the reflective surface 304. Typically, the gas flow GF is directed toward one or both of the first focal point and the second focal point. An opening 316 may be located between the outer surface 314 of the tubular body 310 and the edge 308 of the central aperture 306. In the embodiment of FIG. 4, the outer surface 314 and the edge 308 form or define the opening 316.

The opening 316 (which includes one or more structures forming at least a part of that opening 316, e.g. the outer surface 314 of the tubular body 310 and the edge 308) may be arranged to guide a further gas flow GF' substantially along the reflective surface 304, and away from the tubular body 310 as shown. Nozzles 320 and 322 may be arranged to guide a further gas flow GF' substantially from the circumference of collector 30, along the reflective surface 304, and toward the tubular body 310 as shown. If there is radial flow both from the center and the circumference then the nozzles can be arranged so that the flows meet but still flow substantially adjacent to the surface of the collector 30 except where they meet.

The flow through the tubular body 310 can be referred to as the cone flow. The flow along the surface of the collector 30 from the center towards the circumference can be referred to as the umbrella flow. The flow along the surface of the collector 30 towards the center from the circumference can be referred to as the perimeter flow. The rate of the cone flow for a hydrogen/mitigation gas mixture may be in the range of about 50 SLM to about 165 SLM. The rate of the umbrella flow for a hydrogen/mitigation gas mixture may be in the range of about 40 SLM to about 90 SLM. The rate of the perimeter flow for a hydrogen/mitigation gas mixture may be in the range of about 60 SLM to about 160 SLM. Under these type of H2 flows, pure mitigation gas only flow is from about 0.002 to about 0.8 SCCM. If there is a carrier gas such as an inert gas, the flow rates scale. For example if the mitigation gas mixture is 2% mitigation gas and 98% inert gas, the total flow is about 0.1 to about 40 SCCM. Ultimately it is the mitigation gas partial pressure that matters, which is dependent on the mitigation gas and H2 (dominant flow in vessel) ratio and the pump rate difference of the two gases. Note that the vessel total pressure may be in the range of about 1.2 mbar to about 2.2 mbar.

Alternatively there could be a gas manifold system dedicated to flowing mitigation gas across the surface of the EUV reflective optic in which the apertures/nozzles directed to flow gas along the surface of (with a velocity component substantially locally parallel to) the local surface of the collector 30 are supplied only with mitigation gas.

Figure 5:
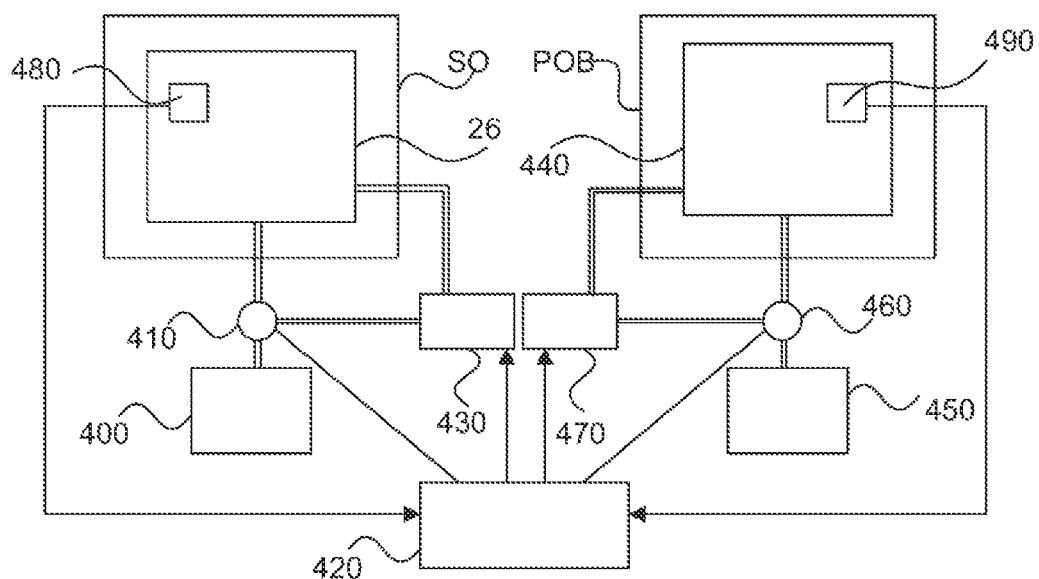
FIG. 5 is a functional block diagram of a system for adding gas to one of more vacuum chambers in an EUV lithography system according to an aspect of an embodiment of the present invention.

FIG. 5 shows a system for controlling the introduction of mitigation gas into the one or more vacuum chambers of a system for generating and utilizing EUV radiation. As shown in FIG. 5, a vacuum chamber 26 of the EUV source SO is connected to a gas source 400 of a source gas such as hydrogen. The conduit relaying the source gas to the vacuum chamber 26 has a mixing node 410 under control of a gas control system 420. The mixing node 410 is also connected to a source 430 of mitigation gas. The gas control system 420 controls whether mitigation gas is added to the flow of source gas entering the chamber 26. The gas control system 420 also controls the mixing ratio of mitigation gas to source gas. Alternatively or in addition the mitigation gas may flow to the chamber 26 directly and under control of the gas control system 420.

FIG. 5 also shows a system for controlling the introduction of mitigation gas into a vacuum chamber 440 of the POB. As shown in FIG. 5, a vacuum chamber 440 of the POB is connected to a source 450 of gas. The conduit relaying the gas to the vacuum chamber 26 has a mixing node 460 under control of a gas control system 420. The mixing node 460 is also connected to a source 470 of mitigation gas. The gas control system 420 controls whether mitigation gas is added to the flow of gas entering the chamber 440. The gas control system 420 also controls the mixing ratio of mitigation gas to gas. Alternatively or in addition the gas may flow to the chamber 440 directly and under control of the gas control system 420.

The gas control system can be configured to add mitigation gas continuously, in-line while the source is operating. The gas control system can be configured to add mitigation gas intermittently. The gas control system can be configured to add mitigation gas while the source is offline. The gas control system can be configured to add mitigation gas and/or control the concentration and/or composition of the mitigation gas based on measurements of reflectivity of the EUV reflective element in the chamber as measured by a sensor 480 or 490. The gas control system can be configured to add mitigation gas and/or control the concentration and/or composition of the mitigation gas based on measurement of mitigation gas concentration adjacent the EUV reflective element as measured by a sensor 480 or 490. The gas control system can be configured to add mitigation gas and/or control the concentration and/or composition of the mitigation gas based on measurements of the amount of time the chamber has been in operation or the number of pulses the source has generated.

Figure 6:
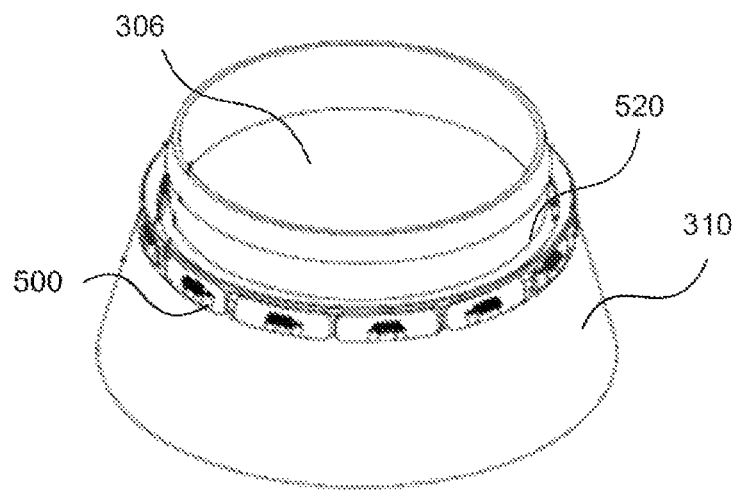
FIG. 6 is a perspective view of a flow cone according to an aspect of an embodiment of the present invention.

An umbrella flow cone 310 in the form of a circumferential gap between inner and outer portions of a tubular body provides a umbrella flow of hydrogen across the reflective surface 304 of the collector 30. This is shown in FIG. 6. and FIGS. 8A-8C.

Figure 9:
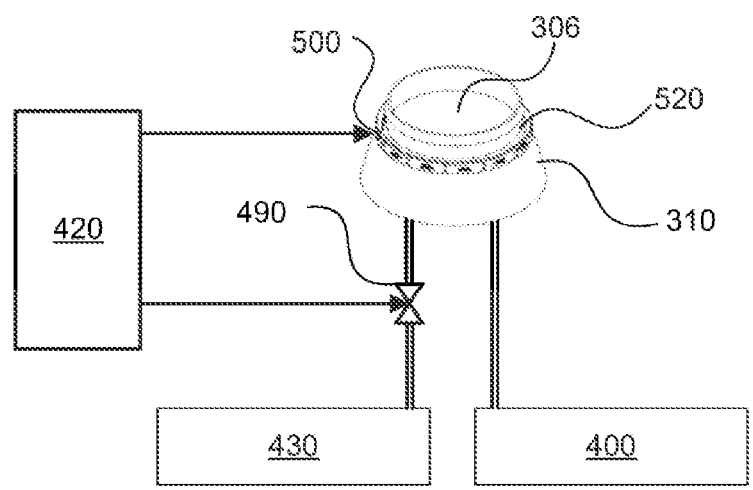
FIG. 9 is a partially perspective, partially schematic diagram of a flow cone with a gas distribution and control system according to an aspect of an embodiment of the present invention.

As shown in FIG. 9, a source 430 of mitigation gas, for example, oxygen, can be connected to the umbrella flow cone 310 through a mixing node 410, e.g., a valve or a controllable inlet to the flow cone 310, to provide a predetermined amount, for example, a trace amount, of the mitigation gas to the umbrella flow from gas source 400. When the valve 490 or inlet opens, a controlled amount of mitigation gas is blended in the hydrogen gas in the umbrella flow. When the inlet closes, only H2 flows through the umbrella flow cone 310. The valve 490 or inlet is controlled by a control signal from the gas control system 420.

Figure 7:
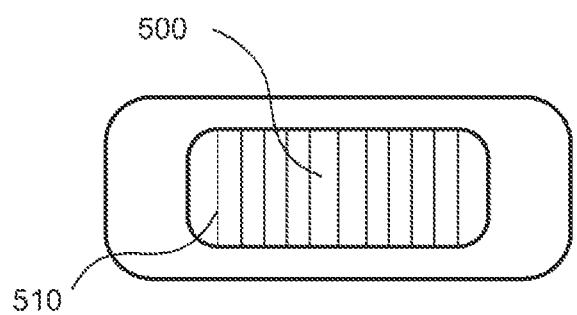
FIG. 7 is a plan view of a flow cone heating element according to an aspect of an embodiment of the present invention.

According to another aspect of an embodiment, the tubular body 310 is provided with one or more heating elements 500. With reference to FIGS. 6 and 7, these heating elements 500 may be arranged around the circumference of the outer portion of the tubular body 310. Each of the heating elements 500 may be made up of one or more filaments 510 and may be selectively energized by the gas control system 420. The heaters 500, when energized, produce hydrogen radicals in the hydrogen flow in the umbrella flow cone 310. The gas control system 420 is arranged to supply energy to the heaters so that the heaters reach a temperature sufficient to achieve a desired dissociation fraction of the hydrogen in the flow, for example, greater than 1300° C. This increases the concentration of H* in the H2 flow around the umbrella cone 310. This in turn enhances Sn etching from the reflective surface 304 and formation of gaseous stannane (SnH4) according to the reaction:

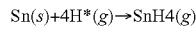

$$Sn(s)+4H^*(g)\rightarrow SnH4(g)$$

According to another aspect, this increase in the concentration of H* in the H2 flow is alternated with the introduction of a mitigation gas such as O2. When the O2 is introduced, it reduces the reverse reaction (conversion of gaseous stannane into solid tin) by poisoning the autocatalytic decomposition of stannane, preventing additional Sn formation. Alternating hydrogen radical production with adding oxygen results in an overall removal of tin staining on the reflective surface 304.

Although in the arrangement just described the hydrogen radicals are generated using a heated filament provided on the tubular body, it is also possible to introduce hydrogen radicals from other or additional sources. For example, it is also possible to deliver H* to the tubular body 310 via a remote source such as a remote plasma source 315 as shown in FIG. 8B below to achieve the same effect.

Figures 8A, 8B:
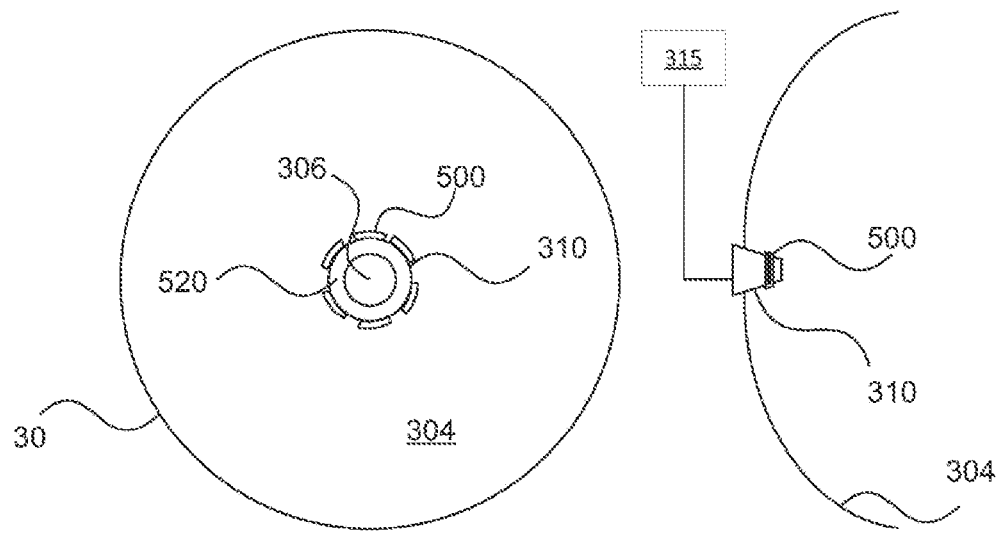
FIGS. 8A-8C are plan, side, and perspective views, respectively, of a collector with a flow cone according to an aspect of an embodiment of the present invention.
Figure 8C:
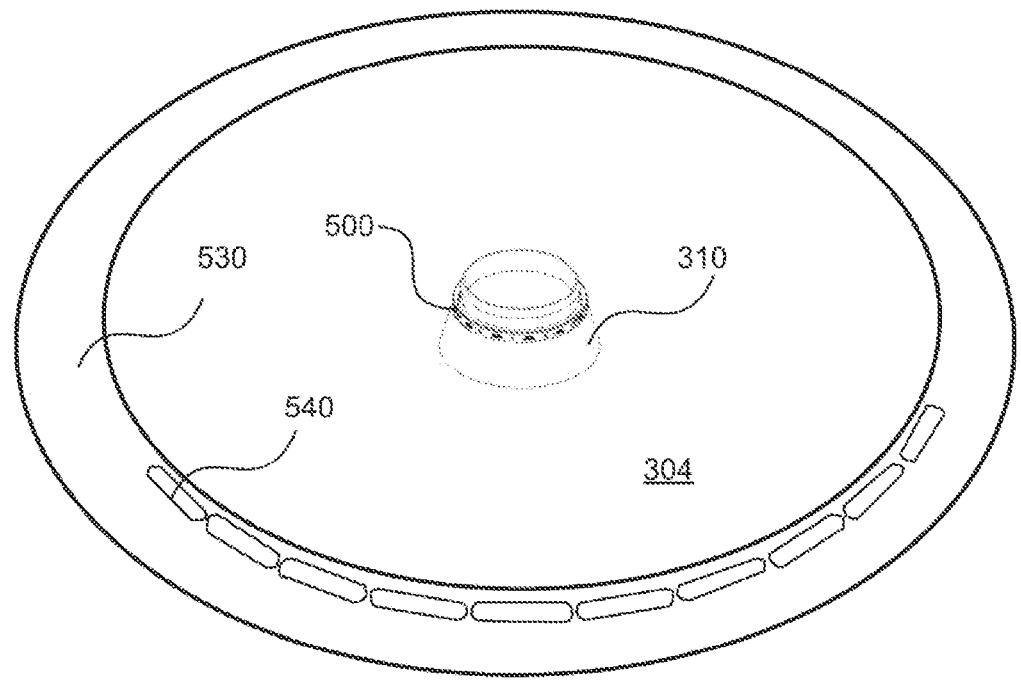

FIG. 8A is a front plan elevation of the collector 30 and its reflective surface 304 and central aperture 306. The umbrella flow cone 310 is defined by inner and outer portions of the tubular body 310. FIG. 8B is a side view of the arrangement of FIG. 8A and FIG. 8C is a perspective view of the arrangement of FIG. 8A also showing a circumferential support 530 for the collector 30 having circumferential gas vents 540 that may be provided to cooperate with the umbrella flow cone 310 to establish the umbrella flow over the reflective surface 304 of the collector 30.

Figure 10:
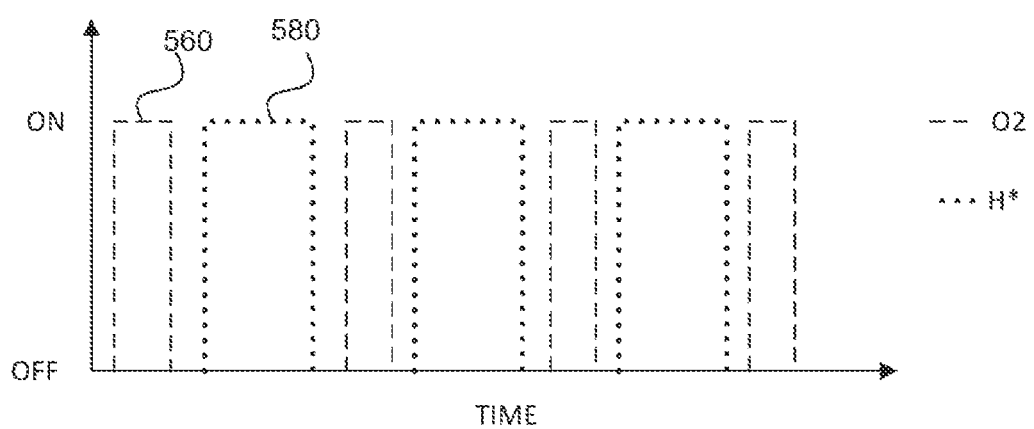
FIG. 10 is a timing diagram illustrating certain principles of operation of a gas distribution and control system according to an aspect of an embodiment of the present invention.

Thus, as shown in FIGS. 9 and 10, the gas control system 420 can be configured to alternately (1) energize the heating elements 500 to produce hydrogen radicals and (2) inject mitigation gas. As shown in FIG. 10, there are intervals 580 when the heater is energized alternating with intervals 560 when the mitigation gas is added to the umbrella flow.

Figure 11:
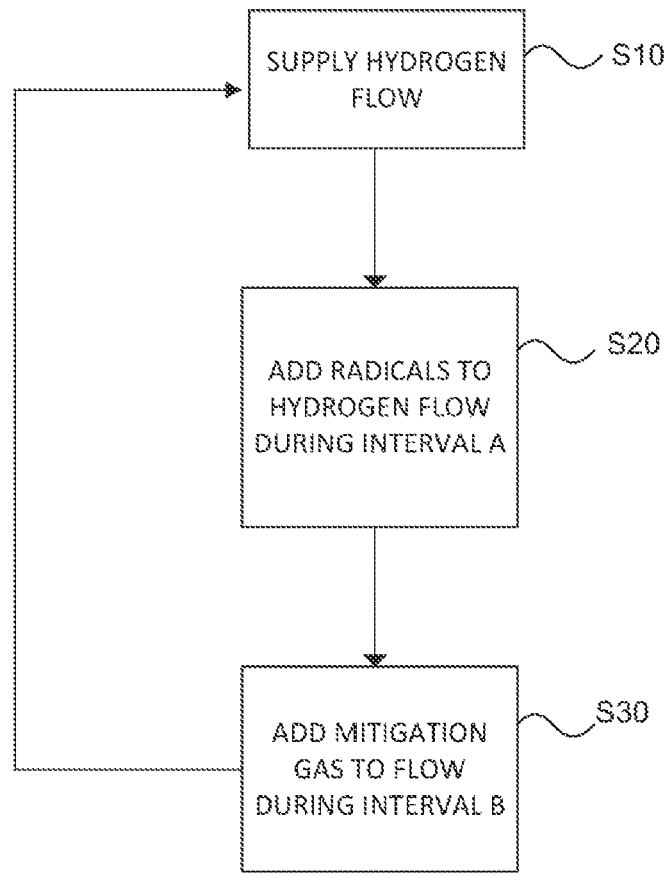
FIG. 11 is a flowchart illustrating certain procedures for using a gas distribution and control system according to an aspect of an embodiment of the present invention.

FIG. 11 is a flowchart describing this procedure. In a step S10 hydrogen is supplied to the umbrella flow cone to establish an umbrella flow of hydrogen. In a step S20 the gas control system 420 energizes the heaters 500 to convert a fraction of the hydrogen in the umbrella flow into radicals for an interval A. After interval A is ended, in a step S30 the gas control system opens the valve 490 to add a predetermined amount of mitigation gas, for example, oxygen, to the umbrella flow for an interval B. Then the process is repeated as desired either to maintain or improve the reflectivity of the reflective optical element in the same environment as the flow cone 310.

Also, as the source is running, molten tin debris continuously arrives at surfaces within the chamber 26 such as the surfaces of the vanes 94. The hydrogen radicals generated during operation of the source interact with the molten tin causing small particles of tin to be ejected from the surface of molten tin. These particles have a typical size of about a micron and they leave the surface at a velocity of few meters per second. This phenomenon is called "tin spitting." The particles produced by tin spitting can end up on the collector which also contributes to EUV reflectivity loss of the collector mirror.

In order to reduce or even completely eliminate tin spitting, periodic addition of a mitigation gas, for example, oxygen as described, can oxidize the tin arriving at the vanes. Oxygen concentrations on the order of 10E-5 mbar can suffice for this purpose. Oxygen exposure can be performed at intervals, for example, about every 1-2 hours of high duty cycle operation of the source. To mitigate the negative effects of oxygen exposure to Sn self-cleaning of the collector surface, this addition of oxygen can occur offline, that is, when no plasma is being produced. Thus, the laser is switched to a mode of operation in which no droplets are produced and a small amount of oxygen may be introduced into the vessel. This can be done though a separate gas supply containing a mix of 2% oxygen and 98% of Ar, for example. Regular hydrogen flow can be permitted to continue uninterrupted because the presence of molecular hydrogen does not interfere with spitting suppression by oxygen. The gas mixture may be 1 slm of an O2/Ar mixture and the normal flow of hydrogen (which may be, for example, about 200 slm). Larger or smaller amounts can be used as well. Also, the hydrogen supply can be switched off during the procedure. The duration of the oxygen exposure time may be on the order of minutes, for example, about 5 min, although it also can be adjusted. After exposure, the normal operation of the source can be resumed.

The oxygen-containing gas may be added to the vessel continuously or intermittently. Continuous supply of the oxygen-containing gas, however, may result in oxidation of the Sn layer present on the collector surface. In this case, a layer of SnOx forms on the collector surface, which could lead to a loss of reflection. Continuous supply of the oxygen-containing gas may also result in oxidation of the silicon layer of the multi-layered mirror collector. In this case, a layer of oxide forms on the collector surface, which would also lead to a loss of reflection. Also, continuous supply of the oxygen-containing gas can significantly increase backsplash from the tin catcher that contaminates the collector. Thus, for some applications it may be desirable to add the oxygen-containing gas to the vessel intermittently rather than continuously regardless of whether the introduction is being alternated with another gas.

Figure 12:
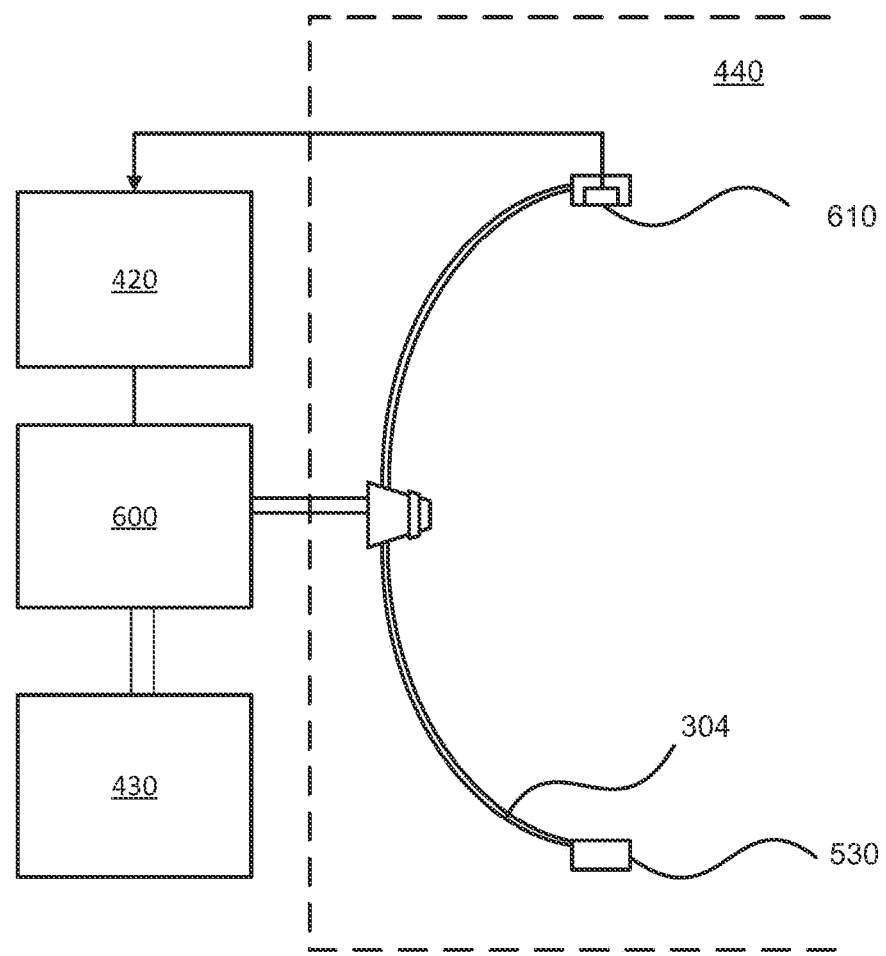
FIG. 12 is a partially schematic functional block diagram of a system for adding oxygen-containing gas to one of more vacuum chambers in an EUV lithography system according to an aspect of an embodiment of the present invention.

Thus, according to an aspect of an embodiment, with reference to FIG. 12, a partial pressure measuring device 610 reads parameters of the source operation conditions in the vessel 440 such as, for example, partial pressure of O2, partial pressure of N2, and partial pressure of H2O, when the reflectivity of the collector reflective surface 304 is within defined specifications. These parameters may then be set and recorded as threshold values. The measuring device 610 may be implemented, for example, by a residual gas mass spectrometer. Preferably, the measuring device 610 will supply measured values on a continuous basis. Also it may be advantageous to have the measuring device 610 sufficiently close to the reflective surface 304 that the partial pressure values measured by the measuring device 610 represent partial pressures adjacent to the reflective surface 304.

Once the in-specification values have been determined, the source is operated and the operating value of at least one of the parameters, e.g., the partial pressure of the oxygen-containing gas, is monitored. If the partial pressure of the oxygen-containing gas is determined to have decreased below the threshold value, then the control system 420 switches the supply of oxygen-containing gas from gas source 430 on by switching on dosing valve 600. The supply of oxygen-containing gas remains on until it is determined that the partial pressure of the oxygen-containing gas has exceeded the threshold value. At that point the control system 420 switches the supply of oxygen-containing gas off.

Figure 13:
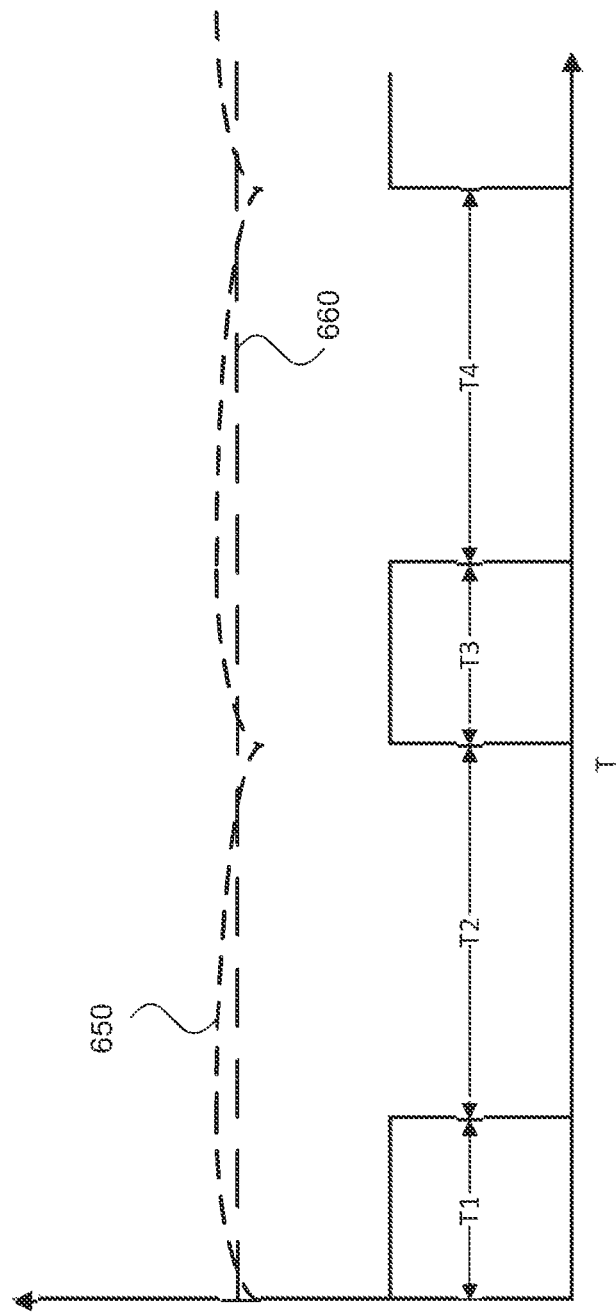
FIG. 13 is a timing diagram illustrating certain principles of operation of a gas distribution and control system according to an aspect of an embodiment of the present invention.

This process is shown graphically in FIG. 13. In FIG. 13, the partial pressure of the oxygen-containing gas as shown by line 650 is built up to an initial level above the threshold level 660 during a time interval T1. After the time interval T1 the supply of oxygen-containing gas to the vessel is shut off. Then, during a time interval T2, the partial pressure of the oxygen-containing gas gradually falls within the vessel as it is depleted. At the end of interval T2, the level falls sufficiently that it drops below the threshold 660. At this time, the control system 420 resumes supplying the oxygen-containing gas to the vessel until the level of oxygen-containing gas is above the threshold level 660. The process continues in this fashion. It will be noted that the gas flow does not necessarily have to be cut off immediately when the threshold value has been met and gas flow does not necessarily have to be resumed immediately when the partial pressure of the oxygen-containing gas falls below the threshold value.

During time interval T1, the flow of oxygen-containing gas can continue, for example, for about thirty minutes. This keeps the collector surface oxidized. During time interval T2, which can last for a time frame of, for example, 3 to 8 hours, there is no excessive oxygen-containing gas in the vessel. There is, however, gradual depletion of the oxygen-containing gas until is partial pressure falls below the threshold. The threshold value will in general be set according to the application, but an exemplary value could be on the order of 4E-8 mbar.

Figure 14:
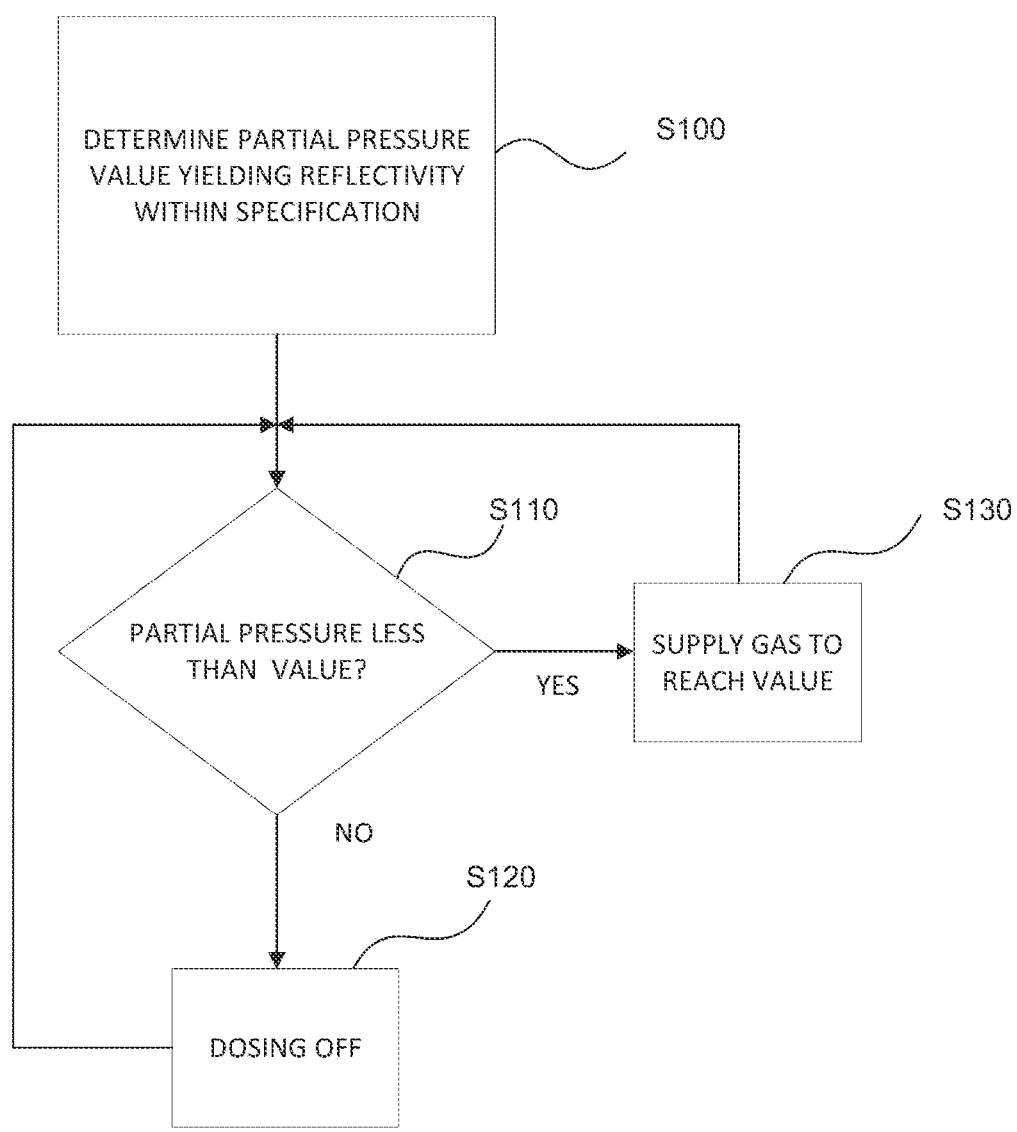
FIG. 14 is a flowchart illustrating certain procedures for using a gas distribution and control system according to an aspect of an embodiment of the present invention.

FIG. 14 is a flowchart describing this process. In a step S100 the partial pressure value yielding in-specification reflectivity of the collector is determined. In a step S110, it is determined whether the partial pressure of the oxygen-containing gas is less than the threshold value. If the determination in step S110 is negative then dosing is shut off in step S120, i.e., the flow of oxygen-containing gas into the vessel is stopped, and the process reverts to determining the partial pressure of the oxygen-containing gas in step S110. If the determination in step S110 is affirmative, then in a step S130 oxygen-containing gas is supplied to reach the value threshold value, i.e., dosing is on.

Figure 15:
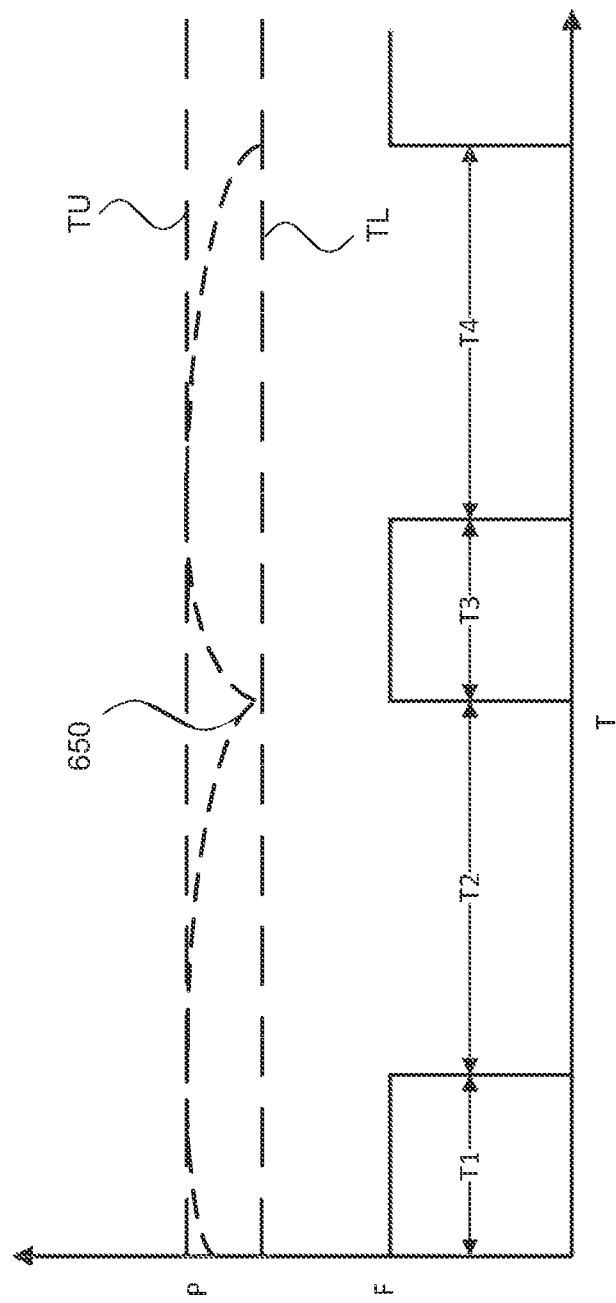
FIG. 15 is a timing diagram illustrating certain principles of operation of a gas distribution and control system according to an aspect of an embodiment of the present invention.

According to another aspect, and as shown in FIG. 15, the system may be operated to maintain the partial pressure of the oxygen-containing gas within a given range rather than above a single threshold value. In such an embodiment, upper and lower threshold values TU and TL are determined for in-specification performance of the collector mirror. The source is operated and the operating value of the source parameters, for example, the partial pressure of the oxygen-containing gas, is monitored. If the partial pressure of the oxygen-containing gas is determined to be below the lower threshold then the control device switches the supply of oxygen-containing gas on such as occurs at the end of time interval T2. The supply of oxygen-containing gas remains on until it is determined that the partial pressure of the oxygen-containing gas has met or exceeded an upper threshold value such as occurs at the end of time interval T3. At that point the control systems switches the supply of oxygen-containing gas off.

Figure 16:
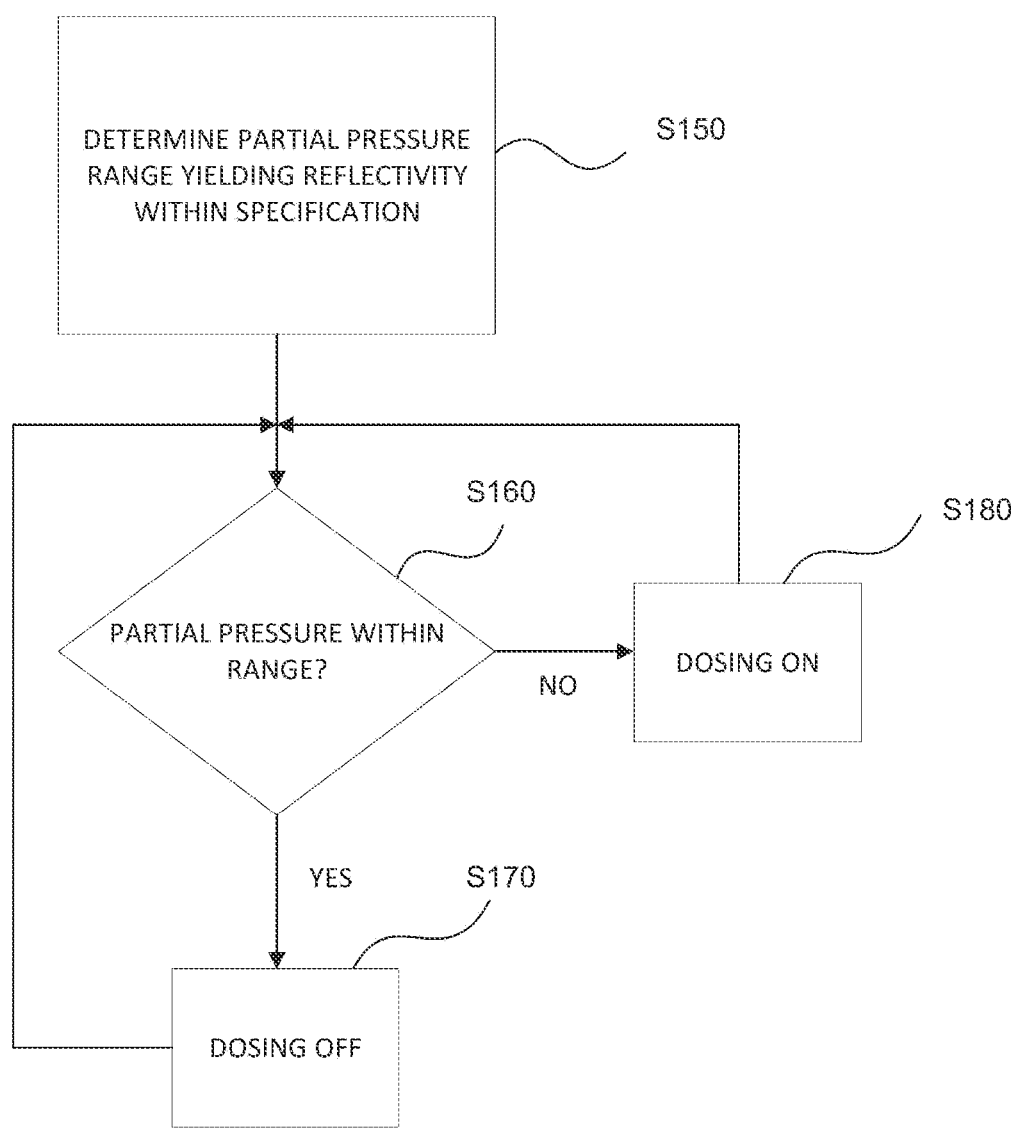
FIG. 16 is a flowchart illustrating certain procedures for using a gas distribution and control system according to an aspect of an embodiment of the present invention.

FIG. 16 is a flowchart describing this process. In a step S150 a partial pressure range yielding in-specification reflectivity is determined. In a step S160 is determined whether the partial pressure of the oxygen-containing gas is within range. If it is, then in step S170 the dosing is turned off, that is, the supply of oxygen-containing gas to the vessel is cut off, and the process reverts to step S160. If the determination step and the S160 is negative, then dosing is turned on in step S180. As mentioned, the partial pressure of the oxygen-containing gas can be measured directly or can be inferred from by measuring the partial pressure of other gases in the vessel.

According to another aspect, the control system can monitor the partial pressure of the oxygen-containing gas. Once the partial pressure of the oxygen-containing gas falls below a certain threshold the control system can turn on the supply of the oxygen-containing gas to the vessel for a period of time which is known a priori to be sufficient to increase the partial pressure of the oxygen-containing gas above a certain threshold. The control system can then shut down gas supply for a for a predetermined time that is known a priori to be the amount of time before depletion will cause the partial pressure of the oxygen-containing gas to fall below the predetermined threshold.

As mentioned, the reflective element may have a capping layer, which may include an oxide such as a metal oxide. Oxygen-containing gases may include any one or combination of the oxygen-containing gases listed above, i.e., O2, H2O, H2O2, O3, CO2, and air. The oxygen-containing gas may be mixed with an inert gas such as argon or helium. For example, the added gas may be an inert gas mixed with at least 0.1% of an oxygen-containing gas.

While the above examples are in terms of oxygen, it will be understood that other gases such as nitrogen may be used by themselves or with oxygen. Also, the direction of flow across the face of the collector may be in any direction. An alternative implementation to achieve the same effect is to deliver mitigation gas and/or radicals from the collector rim towards center, instead of from the center to rim, for the same effect, or from both locations, or alternately, for example, first from rim to center and then from center to rim.

The present disclosure is made with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

Other aspects of the invention are set out in the following numbered clauses.

1. Apparatus comprising:
    a vacuum chamber;
    a reflective optical element arranged in the vacuum chamber;
    a gas distribution system for adding gas to the vacuum chamber, the gas distribution system having an interface for interfacing with a source of a mitigation gas that mitigates, by chemical reaction, contamination of the reflective optical element; and
    a gas control system for controlling the gas distribution system, the gas control system having a state in which the mitigation gas from the source of gas is introduced into the interior of the vacuum chamber in a regulated manner by the gas distribution system.
2. Apparatus as in clause 1 wherein the mitigation gas comprises an oxygen-containing gas.
3. Apparatus as in clause 2 wherein the oxygen-containing gas comprises O2.
4. Apparatus as in clause 2 wherein the oxygen-containing gas comprises H2O.
5. Apparatus as in clause 2 wherein the oxygen-containing gas comprises O3.
6. Apparatus as in clause 2 wherein the oxygen-containing gas comprises CO2.
7. Apparatus as in clause 2 wherein the oxygen-containing gas comprises air.
8. Apparatus as in clause 1 wherein the reflective optical element comprises a multilayer mirror comprising a capping layer and a plurality of underlying layers, the capping layer being arranged to protect the underlying layers from damage.
9. Apparatus as in clause 8 wherein the capping layer comprises an oxide.
10. Apparatus as in clause 9 wherein the oxide comprises a metal oxide.
11. Apparatus as in clause 8 wherein the 1 wherein the mitigation gas comprises an oxygen-containing gas and the insulator comprises a nitride.
12. Apparatus as in clause 8 wherein the insulator comprises a carbide.
13. Apparatus as in clause 1 wherein the gas distribution system is configured to direct flow of the mitigation gas across at least a portion of the capping layer.
14. Apparatus as in clause 1 wherein the gas distribution system is configured to add mitigation gas from the source of gas into the vacuum chamber by adding a quantity of mitigation gas to a flow of hydrogen-containing gas.
15. Apparatus as in clause 1 wherein the gas distribution system is configured to add the mitigation gas to the hydrogen-containing gas by bleeding the mitigation gas into a flow of the hydrogen-containing gas.
16. Apparatus as in clause 1 wherein the gas distribution system is configured to mix the mitigation gas with an inert gas to obtain a mixture containing at least 0.1% mitigation gas.
17. Apparatus as in clause 1 wherein the gas distribution system is configured to mix the mitigation gas with an inert gas.
18. Apparatus as in clause 17 mitigation gas comprises O2 and the inert gas comprises argon.
19. Apparatus as in clause 17 wherein the mitigation gas comprises H2O.
20. Apparatus as in clause 17 wherein the mitigation gas comprises CO2.
21. Apparatus as in clause 17 wherein the mitigation gas comprises O3.
22. Apparatus as in clause 17 wherein the mitigation gas comprises air.
23. Apparatus as in clause 1 wherein the mitigation gas comprises water vapor.
24. Apparatus as in clause 1 wherein gas distribution system is configured to mix the mitigation gas with an inert gas to form a mixture comprising on the order of $10^{-5}$ mbar inert gas and $10^{-7}$ mbar mitigation gas.
25. Apparatus as in clause 1 wherein the reflective optical element has a capping layer and gas distribution system has at least one outlet arranged to generate a flow of gas containing the mitigation gas across at least a portion of the capping layer.
26. Apparatus as in clause 1 wherein the gas control system is configured to add the mitigation gas continuously
27. Apparatus as in clause 1 wherein the gas control system is configured to add the mitigation gas in-line while plasma is being generated.
28. Apparatus as in clause 1 wherein the gas control system is configured to add doses of mitigation gas intermittently.
29. Apparatus as in clause 1 further comprising a sensor arranged to sense a reflectivity of the optical element and produce a signal indicative of the reflectivity, and wherein the gas control system is arranged to receive the signal and is configured to control at least one of mitigation gas concentration and mitigation gas composition based at least in part on the sensed reflectivity.
30. Apparatus as in clause 1 further comprising a sensor arranged to sense mitigation gas concentration adjacent the reflective optical element and produce a signal indicative of a mitigation gas concentration, and wherein the gas control system is arranged to receive the signal and to control at least one of mitigation gas concentration and mitigation gas composition based at least in part on the mitigation gas concentration adjacent the reflective optical element.
31. Apparatus as in clause 1 wherein the reflective optical element is part of an EUV source of EUV radiation and wherein the gas control system is configured to control at least one of mitigation gas concentration and mitigation gas composition based on a duration of operation of the EUV source.

32. Apparatus as in clause 1 wherein the reflective optical element is part of an EUV source of EUV radiation and the gas control system is operative to control at least one of mitigation gas concentration and mitigation gas composition based on a number of pulses of EUV radiation produced by the EUV source.

33. Apparatus as in clause 1 further comprising a plurality of structures located within the vacuum chamber for directing a flow of gas within the vacuum chamber, and further comprising a second gas distribution system arranged to flow the mitigation gas over the structures.

34. Apparatus comprising:
   a vacuum chamber;
   a reflective optical element arranged in the vacuum chamber;
   a primary gas distribution system for adding hydrogen gas to the vacuum chamber;
   a secondary gas distribution system for adding to the vacuum chamber a mitigation gas that mitigates, by chemical reaction, contamination of the reflective optical element; and
   a gas control system for controlling the primary gas distribution system and the secondary gas distribution system, the gas control system having a state in which the mitigation gas is introduced into the interior of the vacuum chamber in a regulated manner by the secondary gas distribution system.

35. A method comprising the steps of:
   measuring an operating parameter of an EUV light source, the EUV light source comprising a vacuum chamber and a reflective optical element located within the chamber; and
   controlling based at least in part on the operating parameter as measured addition to the vacuum chamber of a mitigation gas that mitigates contamination of the reflective optical element by chemical reaction.

36. The method as in clause 35 wherein the step of controlling addition of a mitigation gas comprises controlling a concentration of the mitigation gas.

37. The method as in clause 35 wherein the step of controlling addition of a mitigation gas comprises controlling a flow rate of mitigation gas.

38. The method as in clause 35 wherein the step of controlling addition of a mitigation gas comprises controlling a composition of the mitigation gas.

39. The method as in clause 35 wherein the operating parameter is reflectivity of the optical element.

40. The method as in clause 35 wherein the operating parameter is a concentration of the mitigation gas adjacent the optical element.

41. The method as in clause 35 wherein the operating parameter is a duration of operation of the EUV light source.

42. The method as in clause 35 wherein the operating parameter is a number of EUV pulses produced by the EUV light source since a predefined starting time.

43. Apparatus comprising:
   a vacuum chamber;
   a reflective optical element arranged in the vacuum chamber;
   a gas distribution system having an inlet selectively permitting a flow of gas into the vacuum chamber;
   a source of mitigation gas that mitigates, by chemical reaction, contamination of the reflective optical element in selectable fluid communication with the inlet;
   at least one heating element in thermal communication with the inlet and arranged to heat gas flowing through the inlet to a temperature sufficient to generate radicals in at least a fraction of the gas in the flow of gas; and
   a gas control system configured to control the gas distribution system and the at least one heating element, the gas control system having a first state in which the gas control system causes the mitigation gas to be introduced into the vacuum chamber through the inlet and a second state in which the gas control system causes the at least one heating element to be energized.

44. Apparatus as in clause 43 in which the at least one heating element comprises at least one filament.

45. Apparatus as in clause 43 wherein the mitigation gas comprises an oxygen-containing gas.

46. Apparatus as in clause 45 wherein the oxygen-containing gas comprises O2.

47. Apparatus as in clause 45 wherein the oxygen-containing gas comprises H2O.

48. Apparatus as in clause 45 wherein the oxygen-containing gas comprises O3.

49. Apparatus as in clause 45 wherein the oxygen-containing gas comprises CO2.

50. Apparatus as in clause 45 wherein the oxygen-containing gas comprises air.

51. Apparatus as in clause 43 wherein the mitigation gas is operative to flow across at least a portion of a reflective surface of the reflective optical element.

52. Apparatus as in clause 43 wherein the gas distribution system is operative to introduce mitigation gas from the source of gas into the vacuum chamber by adding a quantity of the mitigation gas to a flow of hydrogen-containing gas.

53. Apparatus as in clause 43 wherein the gas distribution system is configured to introduce mitigation gas from the source of gas into the vacuum chamber by bleeding the mitigation gas into a flow of the hydrogen-containing gas.

54. Apparatus as in clause 43 wherein the inlet comprises a conical element arranged coaxially with and around a central aperture of the reflective optical element.

55. Apparatus as in clause 54 comprising a plurality of heating elements arranged circumferentially around an outer surface of the conical element.

56. Apparatus as in clause 54 in which each of the plurality of heating elements comprises at least one filament.

57. A method of reducing target material contamination of a reflective surface of reflective optical element in an extreme ultraviolet light source, the method comprising the steps of:
   establishing an umbrella flow of hydrogen across the reflective surface;
   ionizing at least a fraction of the hydrogen in the umbrella flow during a first interval;
   adding a predetermined amount of a mitigation gas to the umbrella flow during a second interval distinct from the first interval; and
   alternately repeating the ionizing step and the adding step a plurality of times.

58. Apparatus comprising:
   a vacuum chamber;
   a reflective optical element arranged in the vacuum chamber;
   a gas distribution system having an inlet selectively permitting a flow of gas into the vacuum chamber;
   a source of mitigation gas that mitigates, by chemical reaction, contamination of the reflective optical element in selectable fluid communication with the inlet;
   the gas distribution system being configured to place a source of gas containing radicals in selectable fluid communication with the inlet; and a gas control system configured to control the gas distribution system, the gas control system having a first state in which the gas control system causes the mitigation gas to be introduced into the vacuum chamber through the inlet and a second state in which the gas control system causes the gas containing radicals to be introduced into the vacuum chamber through the inlet.

59. Apparatus as in clause 58 wherein the source of gas containing radicals comprises at least one heating element in thermal communication with the inlet and arranged to heat a flow of gas flowing through the inlet to a temperature sufficient to generate radicals in at least a fraction of the gas in the flow of gas to produce the gas containing radicals.

60. Apparatus as in clause 58 wherein the source of gas containing radicals comprises a plasma source arranged to create radicals in the gas prior to the gas reaching the inlet.

61. A method of reducing target material contamination of a reflective surface of reflective optical element in a vacuum chamber in an extreme ultraviolet light source, the method comprising the steps of:
  (a) starting a flow of mitigation gas into the vacuum chamber;
  (b) stopping a flow of the mitigation gas into the vacuum chamber;
  (c) starting a flow of gas containing radicals into the vacuum chamber;
  (d) stopping a flow of the gas containing radicals into the vacuum chamber;
wherein steps (a)-(d) are repeated in sequence a plurality of times.

62. Apparatus comprising:
  a vacuum chamber;
  a reflective optical element arranged in the vacuum chamber;
  a gas supply system operative to supply at least a first gas and a second gas to the vacuum chamber, the second gas comprising oxygen; and
  a control system operative to control the gas supply system to supply the second gas based at least in part on a partial pressure, sensed in the vacuum chamber, of at least one of the first gas and the second gas.

63. Apparatus as in clause 62 wherein the reflective optical element comprises a capping layer comprising an oxide.

64. Apparatus as in clause 63 wherein the oxide comprises a metal oxide.

65. Apparatus as in clause 62 wherein the control system is operative to control the gas supply system to supply the second gas based at least in part on a partial pressure, sensed in the vacuum chamber, of the second gas.

66. Apparatus as in clause 62 wherein the control system is operative to control the gas supply system to supply the second gas based at least in part on a partial pressure, sensed in the vacuum chamber, of the first gas.

67. Apparatus as in clause 62 wherein the second gas comprises O2.

68. Apparatus as in clause 62 wherein the second gas comprises H2O.

69. Apparatus as in clause 62 wherein the second gas comprises H2O2.

70. Apparatus as in clause 62 wherein the second gas comprises O3.

71. Apparatus as in clause 62 wherein the second gas comprises CO2.

72. Apparatus as in clause 62 wherein the second gas comprises air.

73. Apparatus as claimed in any one of claims 62-72 wherein the second gas comprises an inert gas.

74. Apparatus as in clause 73 wherein the inert gas comprises argon.

75. Apparatus as in clause 73 wherein the inert gas comprises helium.

76. Apparatus as claimed in any one of claims 62-72 wherein the second gas comprises an inert gas mixed with at least 0.1% of an oxygen-containing gas.

77. Apparatus as in clause 62 further comprising a gas pressure sensor arranged to sense a partial pressure of the second gas in the vacuum chamber and to generate a first signal indicative of the partial pressure to the control system, and wherein the control system controls supply of the second gas based at least in part on the first signal.

78. Apparatus as in clause 77 wherein the gas pressure sensor directly senses the partial pressure of the second gas.

79. Apparatus as in clause 77 wherein the gas pressure sensor indirectly senses the partial pressure of the oxygen-containing gas by sensing a partial pressure of at least one gas other than the second gas.

80. Apparatus comprising:
  a vacuum chamber;
  a reflective optical element arranged in the vacuum chamber;
  a gas distribution system for adding gas to the vacuum chamber, the gas distribution system including an interface for interfacing with a source of oxygen-containing gas; and
  a gas control system configured to control the gas distribution system to supply the oxygen-containing gas to the vacuum chamber until a partial pressure of the oxygen-containing gas reaches a first value, ceasing supply of the oxygen-containing gas to the vacuum chamber until the partial pressure of the oxygen-containing gas reaches a second value less than the first value, and resuming supply of the oxygen-containing gas to the vacuum chamber until the partial pressure of the oxygen-containing gas reaches a third value greater than the second value.

81. Apparatus as in clause 80 wherein the reflective optical element comprises a multilayer mirror comprising a capping layer and a plurality of underlying layers, with the capping layer being composed and arranged to protect the underlying layers from damage, the capping layer comprising an oxide.

82. Apparatus as in clause 81 wherein the oxide comprises a metal oxide.

83. Apparatus as in clause 80 wherein the third value is substantially equal to the first value.

84. Apparatus as in clause 80 wherein the oxygen-containing gas comprises O2.

85. Apparatus as in clause 80 wherein the oxygen-containing gas comprises H2O.

86. Apparatus as in clause 80 wherein the oxygen-containing gas comprises H2O2.

87. Apparatus as in clause 80 wherein the oxygen-containing gas comprises O3.

88. Apparatus as in clause 80 wherein the oxygen-containing gas comprises CO2.

89. Apparatus as in clause 80 wherein the oxygen-containing gas comprises air.

90. Apparatus as claimed in any one of claims 80-89 wherein the second gas comprises an inert gas.

91. Apparatus as in clause 90 wherein the inert gas comprises argon.

92. Apparatus as in clause 90 wherein the inert gas comprises helium.

93. Apparatus as claimed in any one of claims 80-92 wherein the second gas comprises an inert gas mixed with at least 0.1% of an oxygen-containing gas.

94. Apparatus as in clause 80 further comprising a gas pressure sensor arranged to sense a partial pressure of the oxygen-containing gas in the vacuum chamber and to generate a first signal indicative of the partial pressure to the gas control system, and wherein the gas control system controls supply of the oxygen-containing gas based at least in part on the first signal.

95. Apparatus as in clause 94 wherein the gas pressure sensor directly senses the partial pressure of the oxygen-containing gas.

96. Apparatus as in clause 94 wherein the gas pressure sensor indirectly senses the partial pressure of the oxygen-containing gas by sensing a partial pressure of at least one gas other than the oxygen-containing gas.

97. Apparatus as in clause 94 wherein the gas pressure sensor is arranged to sense the partial pressure of the oxygen-containing gas proximate to the reflective optical element.

98. A method of prolonging an operational lifetime of a reflective surface in a vacuum chamber of an EUV source, the method comprising the steps of:
    providing a gas supply system operative to supply at least a first gas and a second gas to the vacuum chamber, the second gas comprising oxygen;
    sensing a partial pressure in the vacuum chamber of at least one of the first gas and the second gas;
    controlling the gas supply system to supply the second gas based at least in part on the sensed partial pressure.

99. The method as in clause 98 wherein the sensing step comprises sensing a partial pressure of the second gas.

100. The method as in clause 98 wherein the sensing step comprises sensing a partial pressure of the first gas.

101. The method as in clause 98 wherein the second gas comprises O2.

102. The method as in clause 98 wherein the second gas comprises H2O.

103. The method as in clause 98 wherein the second gas comprises H2O2.

104. The method as in clause 98 wherein the second gas comprises O3.

105. The method as in clause 98 wherein the second gas comprises CO2.

106. The method as in clause 98 wherein the second gas comprises air.

107. The method as in any one of clauses 98-106 wherein the second gas comprises an inert gas.

108. The method as in clause 107 wherein the inert gas comprises argon.

109. The method as in clause 107 wherein the inert gas comprises helium.

110. The method as claimed in any one of claims 98-109 wherein the second gas comprises an inert gas mixed with at least 0.1% of an oxygen-containing gas.

111. A method of prolonging an operational lifetime of a reflective surface in a vacuum chamber of an EUV source, the method comprising the steps of:
    (a) supplying an oxygen-containing gas to the vacuum chamber;
    (b) ceasing supplying the oxygen-containing gas to the vacuum chamber when a partial pressure of the oxygen-containing gas reaches a first value;
    (c) supplying more oxygen-containing gas to the vacuum chamber when the partial pressure of the oxygen-containing gas reaches a second value less than the first value;
    (d) ceasing supplying the oxygen-containing gas to the vacuum chamber when the partial pressure of the oxygen-containing gas reaches a third value greater than the second value; and
    (e) repeating steps (c) and (d) to maintain the partial pressure of the oxygen-containing gas between the first value and the second value.

112. The method as in clause 111 wherein the third value is substantially equal to the first value.

113. The method as in clause 111 wherein the oxygen-containing gas comprises O2.

114. The method as in clause 111 wherein the oxygen-containing gas comprises H2O.

115. The method as in clause 111 wherein the oxygen-containing gas comprises H2O2.

116. The method as in clause 111 wherein the oxygen-containing gas comprises O3.

117. The method as in clause 111 wherein the oxygen-containing gas comprises CO2.

118. The method as in clause 111 wherein the oxygen-containing gas comprises air.

119. The method as claimed in any one of claims 111-118 wherein the second gas comprises an inert gas.

120. The method as in clause 119 wherein the inert gas comprises argon.

121. The method as claimed in claim 119 wherein the inert gas comprises helium.

122. The method as claimed in any one of claims 111-119 wherein the second gas comprises an inert gas mixed with at least 0.1% of an oxygen-containing gas.

123. The method as in clause 111 wherein each of steps (b), (c), and (d) comprises sensing a partial pressure of the oxygen-containing gas in the vacuum chamber.

124. The method as in clause 111 wherein each of steps (b), (c), and (d) comprises directly sensing a partial pressure of the oxygen-containing gas in the vacuum chamber.

125. The method as in clause 111 wherein each of steps (b), (c), and (d) comprises indirectly sensing a partial pressure of the oxygen-containing gas in the vacuum chamber by sensing a partial pressure of at least one gas other than the oxygen-containing gas.

126. The method as in clause 111 wherein each of steps (b), (c), and (d) comprises sensing a partial pressure of the oxygen-containing gas in the vacuum chamber proximate to the reflective surface.

What is claimed is:
1. Apparatus comprising:
    a vacuum chamber;
    a reflective optical element arranged in the vacuum chamber;
    a gas distribution system for adding gas to the vacuum chamber, the gas distribution system including an interface for interfacing with a source of oxygen-containing gas; and
    a gas control system configured to control the gas distribution system to supply the oxygen-containing gas to the vacuum chamber until a partial pressure of the oxygen-containing gas reaches a first value, ceasing supply of the oxygen-containing gas to the vacuum chamber until the partial pressure of the oxygen-containing gas reaches a second value less than the first value, and resuming supply of the oxygen-containing gas to the vacuum chamber until the partial pressure of the oxygen-containing gas reaches a third value greater than the second value.

2. Apparatus as claimed in claim 1 wherein the reflective optical element comprises a multilayer mirror comprising a capping layer and a plurality of underlying layers, with the capping layer being composed and arranged to protect the underlying layers from damage, the capping layer comprising an oxide.

3. Apparatus as claimed in claim 2 wherein the oxide comprises a metal oxide.

4. Apparatus as claimed in claim 1 wherein the oxygen-containing gas comprises H2O2.

5. Apparatus as claimed in claim 1 wherein the oxygen-containing gas comprises O3.

6. Apparatus as claimed in claim 1 wherein the oxygen-containing gas is mixed with argon or helium.

7. Apparatus as claimed in claim 1 further comprising a gas pressure sensor arranged to sense a partial pressure of the oxygen-containing gas in the vacuum chamber and to generate a first signal indicative of the partial pressure to the gas control system, and wherein the gas control system controls supply of the oxygen-containing gas based at least in part on the first signal.

8. Apparatus as claimed in claim 7 wherein the gas pressure sensor indirectly senses the partial pressure of the oxygen-containing gas by sensing a partial pressure of at least one gas other than the oxygen-containing gas.

9. Apparatus as claimed in claim 7 wherein the gas pressure sensor is arranged to sense the partial pressure of the oxygen-containing gas proximate to the reflective optical element.

10. Apparatus as claimed in claim 1 wherein the gas control system is configured to supply the oxygen-containing gas to the vacuum chamber until a partial pressure of the oxygen-containing gas reaches the first value over a first time interval having a first duration and wherein ceasing supply of the oxygen-containing gas to the vacuum chamber until the partial pressure of the oxygen-containing gas reaches a second value less than the first value occurs over a second time interval having a second duration different in magnitude from the first duration.

11. A method of prolonging an operational lifetime of a reflective surface in a vacuum chamber of an EUV source, the method comprising the steps of:
  (a) supplying an oxygen-containing gas to the vacuum chamber;
  (b) ceasing supplying the oxygen-containing gas to the vacuum chamber when a partial pressure of the oxygen-containing gas reaches a first value;
  (c) supplying more oxygen-containing gas to the vacuum chamber when the partial pressure of the oxygen-containing gas reaches a second value less than the first value;
  (d) ceasing supplying the oxygen-containing gas to the vacuum chamber when the partial pressure of the oxygen-containing gas reaches a third value greater than the second value; and
  (e) repeating steps (c) and (d) to maintain the partial pressure of the oxygen-containing gas between the first value and the second value.

12. The method as claimed in claim 11 wherein the third value is substantially equal to the first value.

13. The method as claimed in claim 11 wherein the oxygen-containing gas comprises H2O.

14. The method as claimed in claim 11 wherein the oxygen-containing gas comprises H2O2.

15. The method as claimed in claim 11 wherein the oxygen-containing gas comprises O3.

16. The method as claimed in claim 11 wherein the oxygen-containing gas is mixed with an inert gas.

17. The method as claimed in claim 11 wherein each of steps (b), (c), and (d) comprises directly sensing a partial pressure of the oxygen-containing gas in the vacuum chamber.

18. The method as claimed in claim 11 wherein each of steps (b), (c), and (d) comprises sensing a partial pressure of the oxygen-containing gas in the vacuum chamber proximate to the reflective surface.

19. The method as claimed in claim 11 wherein supplying an oxygen-containing gas to the vacuum chamber continues over a first interval having a first duration and wherein ceasing supplying the oxygen-containing gas to the vacuum chamber when a partial pressure of the oxygen-containing gas reaches a first value continues over a second interval having a second duration different in magnitude from the first duration.

20. Apparatus for producing extreme ultraviolet (EUV) radiation, the apparatus comprising:
  a vacuum chamber;
  a collector mirror arranged in the vacuum chamber to have a primary focus at an irradiation region in the vacuum chamber;
  a gas distribution system for adding gas to the vacuum chamber, the gas distribution system having an interface for interfacing with a source of a mitigation gas that mitigates, by chemical reaction, contamination of the collector mirror, the mitigation gas comprising H2O2; and
  a gas control system for controlling the gas distribution system, the gas control system having a first state with a first duration in which the mitigation gas from the source of gas is introduced into the interior of the vacuum chamber in a regulated manner by the gas distribution system until a first partial pressure of the mitigation gas is attained and a second state with a second duration in which the mitigation gas from the source of gas is not introduced into the interior of the vacuum chamber by the gas distribution system, the second state continuing a second duration until a second partial pressure of the mitigation gas is attained.

21. Apparatus as claimed in claim 20 wherein the collector mirror comprises a multilayer mirror comprising a capping layer and a plurality of underlying layers, the capping layer being arranged to protect the underlying layers from damage.

22. Apparatus as claimed in claim 21 wherein the capping layer comprises an oxide.

23. Apparatus as claimed in claim 21 wherein the capping layer comprises a nitride or a carbide.

24. Apparatus as claimed in claim 20 wherein the gas distribution system is configured to add mitigation gas from the source of gas into the vacuum chamber by adding a quantity of mitigation gas to a flow of hydrogen-containing gas.

25. Apparatus as claimed in claim 20 wherein the gas distribution system is configured to mix the mitigation gas with an inert gas.

* * * * *